(12) United States Patent
Tseng et al.

(10) Patent No.: US 11,810,863 B2
(45) Date of Patent: Nov. 7, 2023

(54) SENSOR

(71) Applicant: TDK TAIWAN CORP., Taoyuan (TW)

(72) Inventors: An-Ping Tseng, Taoyuan (TW); Chi-Fu Wu, Taoyuan (TW); Hao-Yu Wu, Taoyuan (TW); Ming-Hung Wu, Taoyuan (TW); Chun-Yang Tai, Taoyuan (TW); Tsutomu Fukai, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 81 days.

(21) Appl. No.: 16/430,993

(22) Filed: Jun. 4, 2019

(65) Prior Publication Data

US 2020/0185327 A1 Jun. 11, 2020

(30) Foreign Application Priority Data

Dec. 6, 2018 (CN) .......................... 201811486727.X

(51) Int. Cl.
*H01L 23/04* (2006.01)
*H01L 23/538* (2006.01)
(Continued)

(52) U.S. Cl.
CPC ........ *H01L 23/5386* (2013.01); *B81B 7/0061* (2013.01); *H01L 21/4857* (2013.01); *H01L 21/6835* (2013.01); *H01L 23/04* (2013.01); *H01L 23/13* (2013.01); *H01L 23/49816* (2013.01); *H01L 23/5383* (2013.01); *H01L 23/5389* (2013.01); *H01L 23/642* (2013.01); *B81B 2201/0257* (2013.01); *B81B 2207/012* (2013.01); *B81B 2207/07* (2013.01); *H01L 24/16* (2013.01); *H01L 24/48* (2013.01); *H01L 2221/68345* (2013.01);
(Continued)

(58) Field of Classification Search
CPC .. H01L 23/04; H01L 23/13; H01L 23/149816
See application file for complete search history.

(56) References Cited

U.S. PATENT DOCUMENTS

2015/0023523 A1   1/2015  Elian et al.
2016/0197594 A1*  7/2016  Hanzawa ............... H01C 7/008
                                                                310/348
(Continued)

FOREIGN PATENT DOCUMENTS

TW    201338140 A    9/2013
TW    201351626 A    12/2013

OTHER PUBLICATIONS

Office Action dated Oct. 12, 2021 for the corresponding Application No. 107143813 in Taiwan.

*Primary Examiner* — Trang Q Tran
(74) *Attorney, Agent, or Firm* — Muncy, Geissler, Olds & Lowe, P.C.

(57) ABSTRACT

A sensor is provided, including a substrate, a chip and a sensing element. The substrate has a plate-like shape and includes a surface and an interconnect structure disposed in the substrate. The chip is embedded in the substrate and is electrically connected to the interconnect structure. The sensing element is disposed on the surface of the substrate, and is electrically connected to the chip through the interconnect structure.

15 Claims, 29 Drawing Sheets

(51) Int. Cl.
*H01L 23/64* (2006.01)
*H01L 23/498* (2006.01)
*H01L 21/48* (2006.01)
*H01L 21/683* (2006.01)
*B81B 7/00* (2006.01)
*H01L 23/13* (2006.01)
*H01L 23/00* (2006.01)

(52) U.S. Cl.
CPC ............... *H01L 2221/68359* (2013.01); *H01L 2224/16237* (2013.01); *H01L 2224/48091* (2013.01); *H01L 2224/48106* (2013.01); *H01L 2224/48228* (2013.01); *H01L 2924/1433* (2013.01); *H01L 2924/1461* (2013.01)

(56) References Cited

U.S. PATENT DOCUMENTS

| | | | | |
|---|---|---|---|---|
| 2016/0368760 | A1* | 12/2016 | Chen | B81B 3/0027 |
| 2017/0313579 | A1* | 11/2017 | Ghidoni | B81B 7/0061 |
| 2019/0062150 | A1* | 2/2019 | Moitzi | B81B 7/0074 |
| 2019/0304912 | A1* | 10/2019 | Ecton | H01L 23/5381 |

* cited by examiner

SENSOR

CROSS-REFERENCE TO RELATED APPLICATIONS

The present application claims priority to China Patent Application No. 201811486727.X, filed on Dec. 6, 2018, which is incorporated by reference herein in the entirety.

BACKGROUND OF THE DISCLOSURE

Field of the Disclosure

The present disclosure relates to a sensor, and more particularly to a micro sensor.

Description of the Related Art

The semiconductor integrated circuit (IC) industry has experienced exponential growth. Technological advances in IC materials and design have produced generations of ICs where each generation has smaller and more complex circuits than the previous generation, and these ICs are applied in devices that are used daily (e.g. cell phones, transformers, batteries, cars, etc.). In order to further enhance the efficiency of the IC devices, various miniaturization methods for enhancing manufacturing efficiency and reducing the cost are desired in the industry. For example, a substrate occupies a certain amount of space in the micro sensors of the current electronic devices (e.g. microphone, gyroscope, etc.), so the remaining space available for other elements (e.g. batteries) is limited. If the space occupied by the substrate can be reduced, the additional space may be utilized flexibly to meet the user's needs.

In the current sensors, microelectromechanical systems (MEMS) elements and application-specific integrated circuit (ASIC) chips are disposed on the surface of a substrate to form a sensor (e.g. a micro sensor) to perform sensing and data analysis, respectively. However, the space requirements in current electronic devices are getting higher. Therefore, how to further reduce the space occupied by the elements is a concern in the industry.

BRIEF SUMMARY OF THE DISCLOSURE

Some embodiments of the present disclosure relate to a micro sensor, including a substrate, a chip and a sensing element. The substrate has a plate-like shape and includes a surface and an interconnect structure disposed in the substrate. The chip is embedded in the substrate and is electrically connected to the interconnect structure. The sensing element is disposed on the surface of the substrate, and is electrically connected to the chip through the interconnect structure.

The micro sensor according to some embodiments of the present disclosure further includes a case disposed on the substrate, the substrate and the case form a space, and the sensing element is disposed in the space. The substrate includes a through hole which partially overlaps with the sensing element in the direction that is perpendicular to the surface of the substrate. The through hole includes a first segment, a second segment and a third segment sequentially arranged in a direction that is perpendicular to the substrate, and the dimension of the second segment is greater than the first segment and the third segment. In other embodiments, the dimension of the second segment is less than the first segment and the third segment. Furthermore, the distance between the first segment and the sensing element is greater than the distance between the third segment and the sensing element, and the dimension of the third segment is greater than the first segment and the second segment.

The micro sensor according to some embodiments of the present disclosure further includes a passive element disposed in the substrate and electrically connected to the chip. The passive element is formed from the interconnect structure. In the direction that is perpendicular to the surface of the substrate, at least a portion of the chip overlaps the sensing element. Furthermore, the micro sensor further includes a second sensing element disposed on the substrate, and the sensing element and the second sensing element are disposed on opposite sides of the substrate. Moreover, the micro sensor further includes a circuit board disposed with the sensing element on the same side of the substrate, and the circuit board is electrically connected the substrate. A gap is formed between the sensing element and the circuit board in the direction that is perpendicular to the surface of the substrate. The micro sensor further includes sealing material disposed between the substrate and the circuit board, the substrate further includes a through hole partially overlaps the sensing element in the direction that is perpendicular to the surface of the substrate, and the sealing material covers the through hole. The circuit board includes a hole which partially overlaps the sensing element in the direction that is perpendicular to the surface of the substrate, and the sealing material covers the hole. The substrate includes a recess, and the second sensing element is positioned in the recess.

Some embodiments of the present disclosure relate to a micro sensor, including a substrate, a first chip, a second chip, a first sensing element, a second sensing element, a first interconnect structure, and a second interconnect structure. The first chip and the second ship are disposed in the substrate. The first sensing element and the second sensing element are disposed on the substrate and correspond to the first chip and the second chip, respectively. The first interconnect structure and the second interconnect structure are disposed in the substrate, the first interconnect structure electrically connected to the first chip and the first sensing element, and the second interconnect structure electrically connected to the second chip and the second sensing element.

In some embodiments of the present disclosure, the first sensing element and the second sensing element are disposed on the same side of the substrate, and the substrate includes a through hole overlaps the first sensing element in the direction that is perpendicular to the substrate. The first sensing element and the second sensing element are disposed on the same side of the substrate, and the micro sensor further includes a first case and a second case disposed on the substrate, the first sensing element is disposed in a space formed by the substrate and the first case, and the second sensing element is disposed in a space formed by the substrate and the second case. In some embodiments, the first sensing element and the second sensing element are disposed on opposite sides of the substrate, and at least a portion of the first chip overlaps the second chip in the direction that is perpendicular to the substrate.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
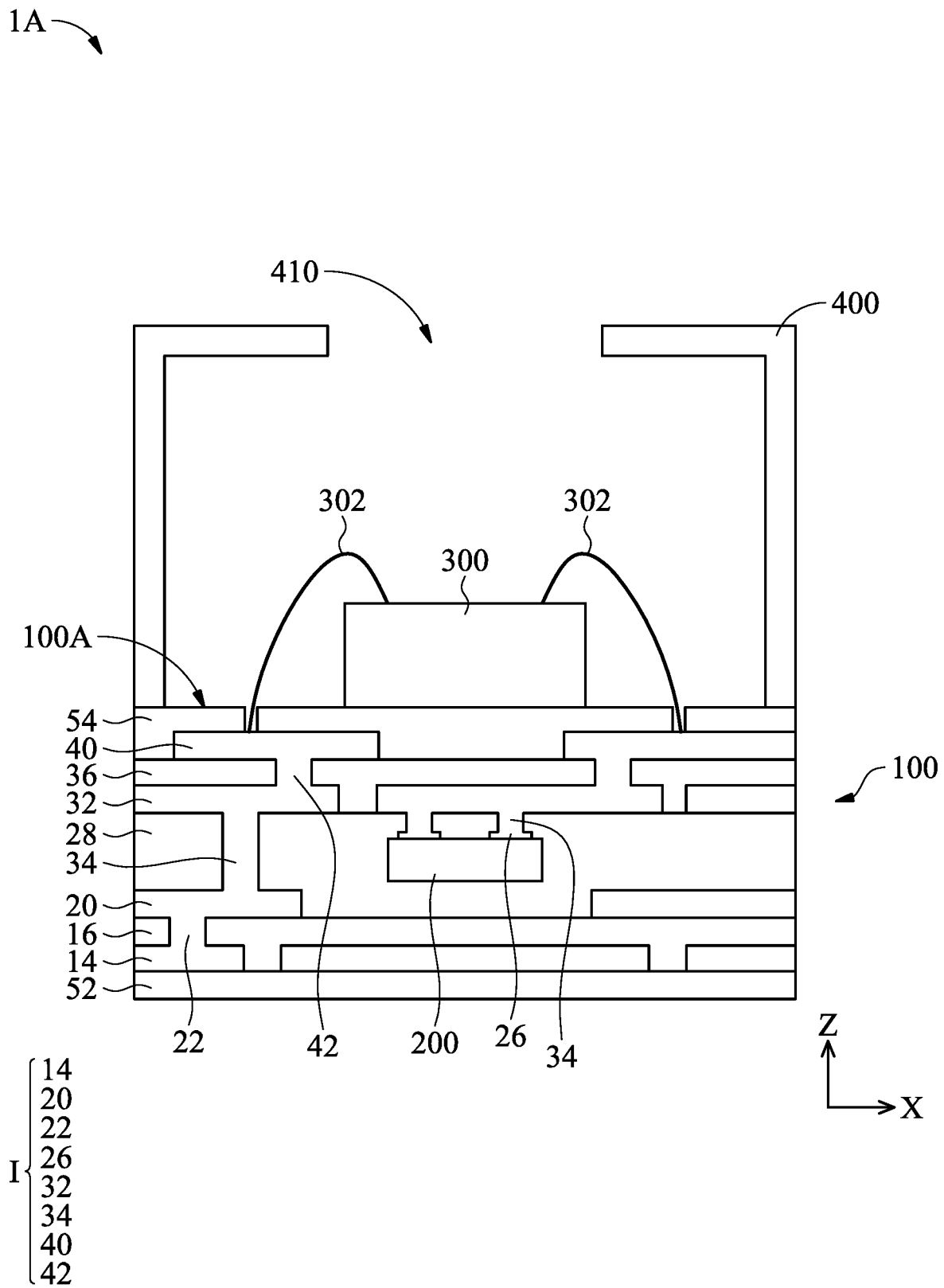
FIG. 1A is a schematic view of a sensor illustrated according to some embodiments.

The following disclosure provides many different embodiments, or examples, for implementing different features of the provided subject matter. Specific examples of components and arrangements are described below to simplify the present disclosure. These are, of course, merely examples and are not intended to be limiting.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In addition, the present disclosure may repeat reference numerals and/or letters in the various embodiments. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "below", "under", "horizontal", "vertical", "upward", "higher", "downward", "lower", "up", "down', "top", "bottom" etc. as well as derivatives thereof (e.g., "horizontally", "downwardly", "upwardly", etc.) are used for ease of the present disclosure of one features relationship to another feature. The spatially relative terms are intended to cover different orientations of the device including the features.

Referring to FIG. 1A of the present disclosure, a sensor 1A (micro sensor) according to some embodiments is illustrated. The sensor 1A includes a substrate 100, a chip 200, a sensing element 300, a case 400 and an interconnect structure I (includes wiring layers 14, 20, 32, 40 and vias 22, 34, 42 and a conductive pad 26) disposed in the substrate 100. The substrate 100 has a plate-like shape and includes a surface 100A. The chip 200 is embedded in the substrate 100. The interconnect structure I is disposed in the substrate 100 and electrically connected to the chip 200. The sensing element 300 is disposed on the surface 100A and electrically connected to the chip 200 through the interconnect structure I and the wiring 302. The case 400 is disposed on the substrate 100, wherein the substrate 100 and the case 400 form a space, and the sensing element 300 is disposed in the space.

The substrate 100 includes insulating layers 16, 28, 36, interconnect structure I (including wiring layers 14, 20, 32, 40 and vias 22, 34, 42 and conductive pad 26) disposed in the substrate 100, and passivation layers 52 and 54 disposed on opposite surfaces of the substrate 100. In particular, the wiring layer 14 is disposed between the passivation layer 52 and the insulating layer 16, the wiring layer 20 is disposed between the insulating layers 16 and 28, the wiring layer 32 is disposed between the insulating layers 28 and 36, and the wiring layer 40 is disposed between the insulating layer 36 and the passivation layer 54; the vias 22 are disposed in the insulating layer 16, the vias 34 are disposed in the insulating layer 28, and the vias 42 are disposed in the insulating layer 36. Furthermore, the chip 200 is embedded in the insulating layer 28, and the conductive pads 26 are disposed on the chip 200. The chip 200 and the interconnect structure I are electrically connected through the conductive pads 26 and the vias 34. The insulating layer 16 and the insulating layer 36 overlap the chip 200 when viewed in a direction that is perpendicular to the surface 100A, and the chip 200 is located between the insulating layer 16 and the insulating layer 36 when viewed in a direction that is parallel to the surface 100A. The insulating layer 16 and the insulating layer 36 at least partially overlap the first sensing element 300 when viewed in a direction that is perpendicular to the surface 100A.

The interconnect structure I (includes the wiring layers 14, 20, 32, 40, the vias 22, 34, 42 and the conductive pad 26) may include suitable conductive materials such as copper. A person having ordinary skill in the art can realize that other conductive materials for the interconnect structure I are included in the scope and spirit of the present embodiment. In some embodiments, the passivation layers 52 and 54 are solder mask. In some embodiments, the passivation layers 52 and 54 are formed by polymer. In some embodiments, the passivation layers 52 and 54 are formed from chemical vapor deposition, spin-on coating, sputtering or the combination thereof.

The material of the insulating layers 16 and 36 may be similar or identical resin material, such as FR-4 or Bismaleimide Triazine (BT). The material of the insulating layer 28 may be different than the insulating layer 16 or 36, such as glue having fluidity when being heated. As a result, the element being embedded (e.g. the chip 200) may be fully covered by the insulating layer 28, and the risk of delamination may be prevented. Furthermore, glass fibers may be disposed in the insulating layer 16 or 36 to increase the heat conductivity, so heat generated by the operation of the chip 200 in the substrate 100 may be further dissipated. Moreover, the glass fibers may also enhance the supporting force of the insulating layer 16 or 36 to the substrate 100.

The chip 200 may be, for example, an application-specific integrated circuit (ASIC) to process the signal generated from the sensing element 300. The sensing element 300 may be any suitable sensor, such as a gyroscope, an acoustic sensor (such as a microphone), a pressure sensor, a temperature sensor, etc. In other words, the sensing element 300 may be a microelectromechanical systems (MEMS) element. It should be noted that the wiring 302 electrically connected to the sensing element 300 and the interconnect structure I may pass through the passivation layer 54 and directly contact the wiring layer 40. Furthermore, an opening 410 may form on the case 400 to allow the sensing element 300 to communicate with the external environment to enhance the sensing effect of the sensing element 300. For example, the opening 410 may allow external sound to be conducted to the sensing element 300 through the air. Therefore, the sound detected by the sensing element 300 may be clearer.

The chip 200 is embedded in the substrate 100 in this embodiment, so no additional packaging is required for the chip 200. As a result, the space occupied by the chip 200 may be reduced to achieve miniaturization. Furthermore, the case 400 is formed by metal (e.g. brass or alloy thereof) to protect the sensing element 300 from being interfered with by external noise (e.g. electromagnetic wave, etc.), so the accuracy of sensing may be enhanced.

It should be noted that at least a portion of the chip 200 overlaps the sensing element 300 in a direction that is perpendicular to the surface 100A (Z direction). As a result, the distance between the chip 200 and the sensing element 300 may be reduced, so the length of the signal transporting path between the chip 200 and the sensing element 300 may be reduced. Therefore, the efficiency of the sensor 1A may me increased and miniaturization may be achieved.

Figure 1B:
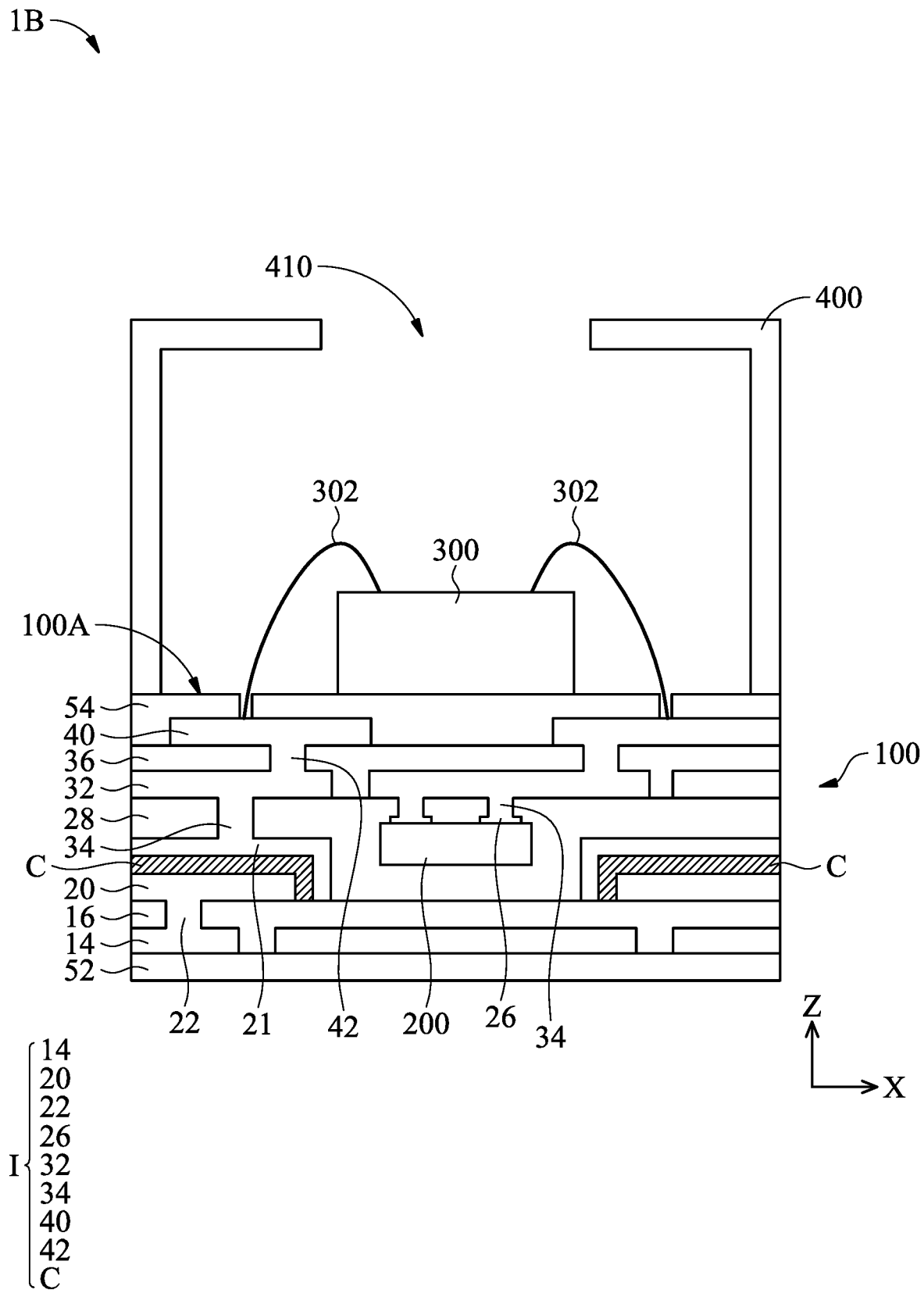
FIG. 1B is a schematic view of a sensor illustrated according to some embodiments.

Furthermore, other elements electrically connected to the chip 200 may also be disposed in the substrate 100, such as passive elements like capacitor, resistor, inductor, etc. For example, referring to FIG. 1B, a sensor 1B according to another embodiment of the present disclosure is illustrated. The difference between the sensor 1B and the sensor 1A in FIG. 1A is that the sensor 1B further includes a wiring layer 21 and a capacitor C disposed between the wiring layers 20 and 21. In other words, the capacitor C is a portion of the interconnect structure I in this embodiment. The material of the capacitor C may be any suitable dielectric material to act as a capacitor. Because the capacitor C is disposed in the substrate 100 and electrically connected to the chip 200, the size of the sensor 1B may be further reduced to achieve miniaturization. Furthermore, because the capacitor C can act as a filter, noise may be reduced if the distance between the capacitor C and the chip 200 or the sensing element 300 is decreased, so the sensing effect may be further enhanced. However, the present disclosure is not limited thereto. For example, the capacitor C may be replaced by other elements (e.g. passive elements such as resistor or inductor, etc.) to achieve the desired functions.

Figure 2A:
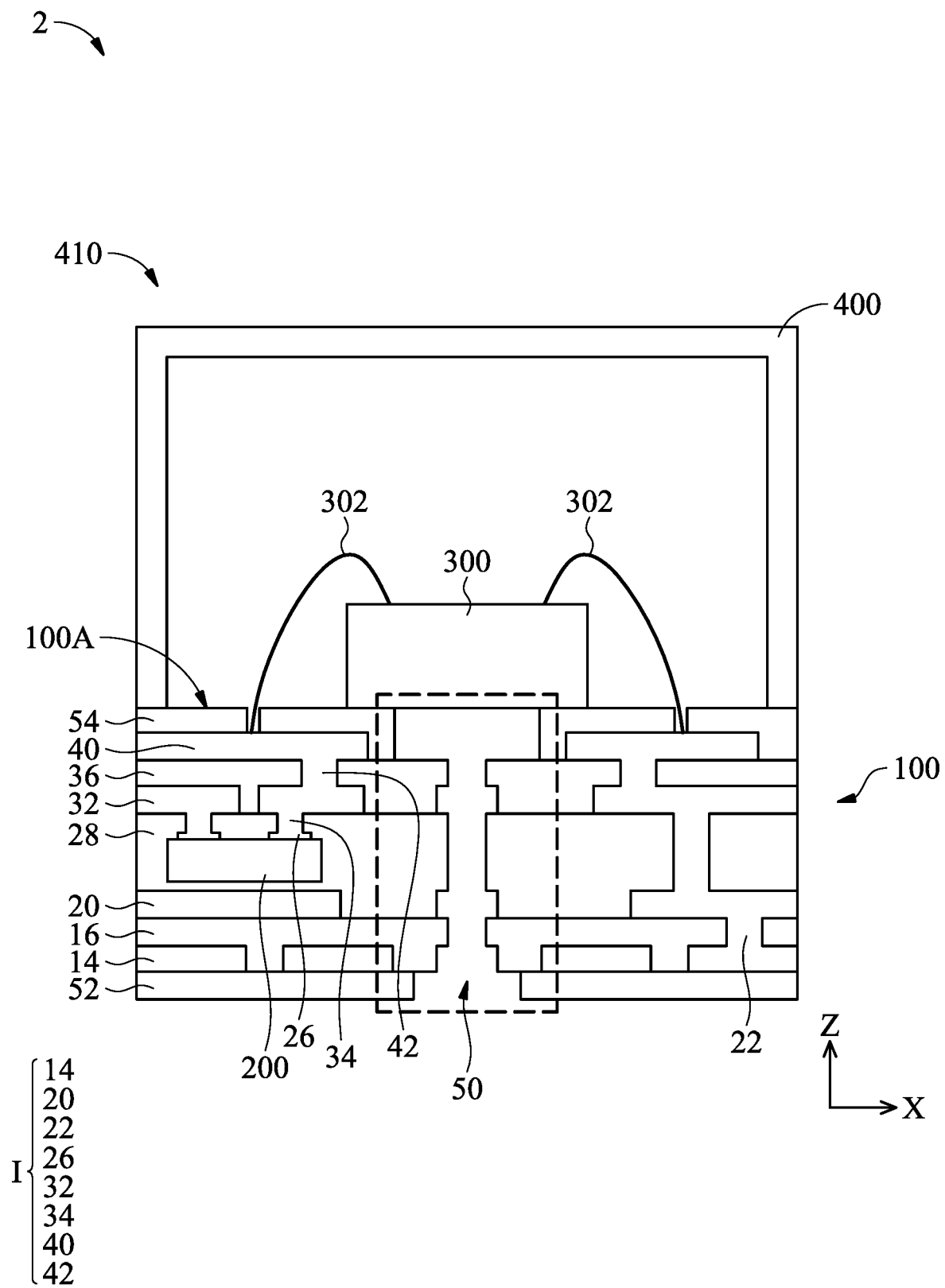
FIG. 2A is a schematic view of a sensor illustrated according to some embodiments.

In some embodiments, it is also possible not to form any opening on the case 400. Instead, a through hole may be formed on the substrate 100 and may correspond to the sensing element 300 to allow the sensing element 300 to communicate with the external environment and enhance the sensing function of the sensing element 300. Referring to FIG. 2A, a sensor 2 according to an embodiment of the present disclosure is illustrated. A through hole 50 is formed in the substrate 100 of the sensor 2. The through hole 50 partially overlaps to the sensing element 300 in the direction that is perpendicular to the surface 100A (Z direction in FIG. 2) to allow the sensing element 300 to communicate with the external environment, and the sensing function of the sensing element 300 may be enhanced.

Figure 2B:
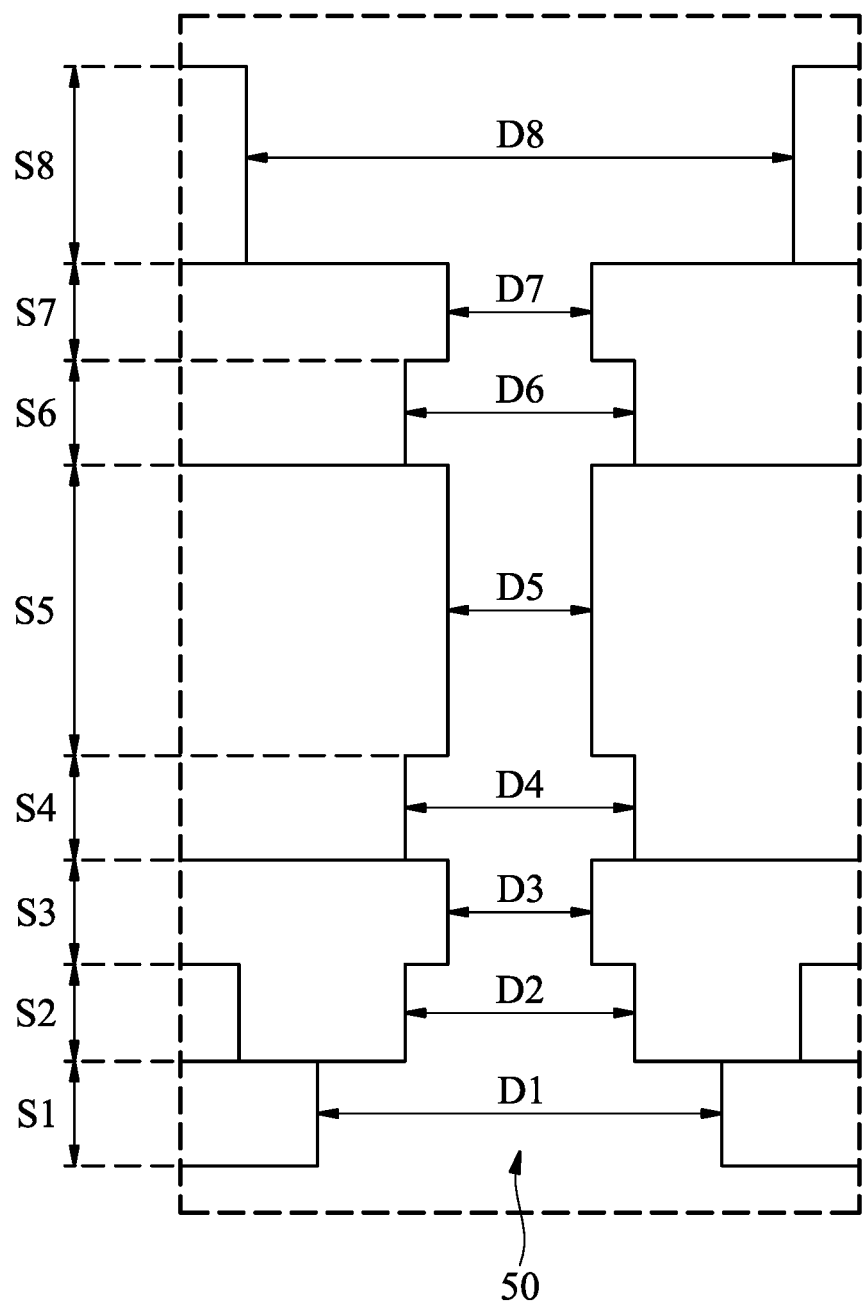
FIG. 2B is a schematic view of a sensor illustrated according to some embodiments.

It should be noted that the through hole 50 includes several segments having different dimensions and is formed from laser etching drilling process. As a result, it is allowed to drill a hole on a small substrate (e.g. 2 mm*2 mm or 3 mm*3 mm) without influencing the flatness of the substrate. Furthermore, no stress may be concentrated on the substrate by the laser etching drilling process, so the substrate may be prevented from being damaged. For example, FIG. 2B is an enlarged view of the through hole 50 in FIG. 2A. In a direction that is perpendicular to the surface 100A (+Z direction), the through hole 50 has segments S1, S2, S3, S4, S5, S6, S7 and S8 arranged sequentially, and their dimensions are D1, D2, D3, D4, D5, D6, D7 and D8, respectively, wherein each segment has a different dimension to adjacent segments. In this embodiment, D1>D2; D2>D3; D3<D4; D4>D5; D5<D6; D6>D7; D7<D8. As a result, for example, in the segments S3, S4 and S5 arranged sequentially, the dimension D4 of the segment S4 is greater than the dimension D3 of the segment S3 and the dimension D5 of the segment S5. Furthermore, in the segments S6, S7 and S8 arranged sequentially, the dimension D7 of the segment S7 is less than the dimension D6 of the segment S6 and the dimension D8 of the segment S8. Moreover, the distance between the segment S6 and the sensing element 300 is greater than the distance between the segment S8 and the sensing element 300, and the dimension D8 of the segment S8 may be greater than the dimension D6 of the segment S6 and the dimension D7 of the segment S7. Furthermore, the through hole 50 is formed from laser etching drilling process, so the sidewalls of the segments S1, S2, S3, S4, S5, S6, S7 and S8 of the through hole 50 are substantially perpendicular to the surface 100A. By forming the through hole 50 through laser etching drilling process, debris may be prevented from generated in the through hole 50 to maintain the cleanliness in the through hole 50. Furthermore, the risk of the elements embedded in the substrate 100 (e.g. the chip 200) being damaged in the drilling process may be reduced.

Figure 3A:
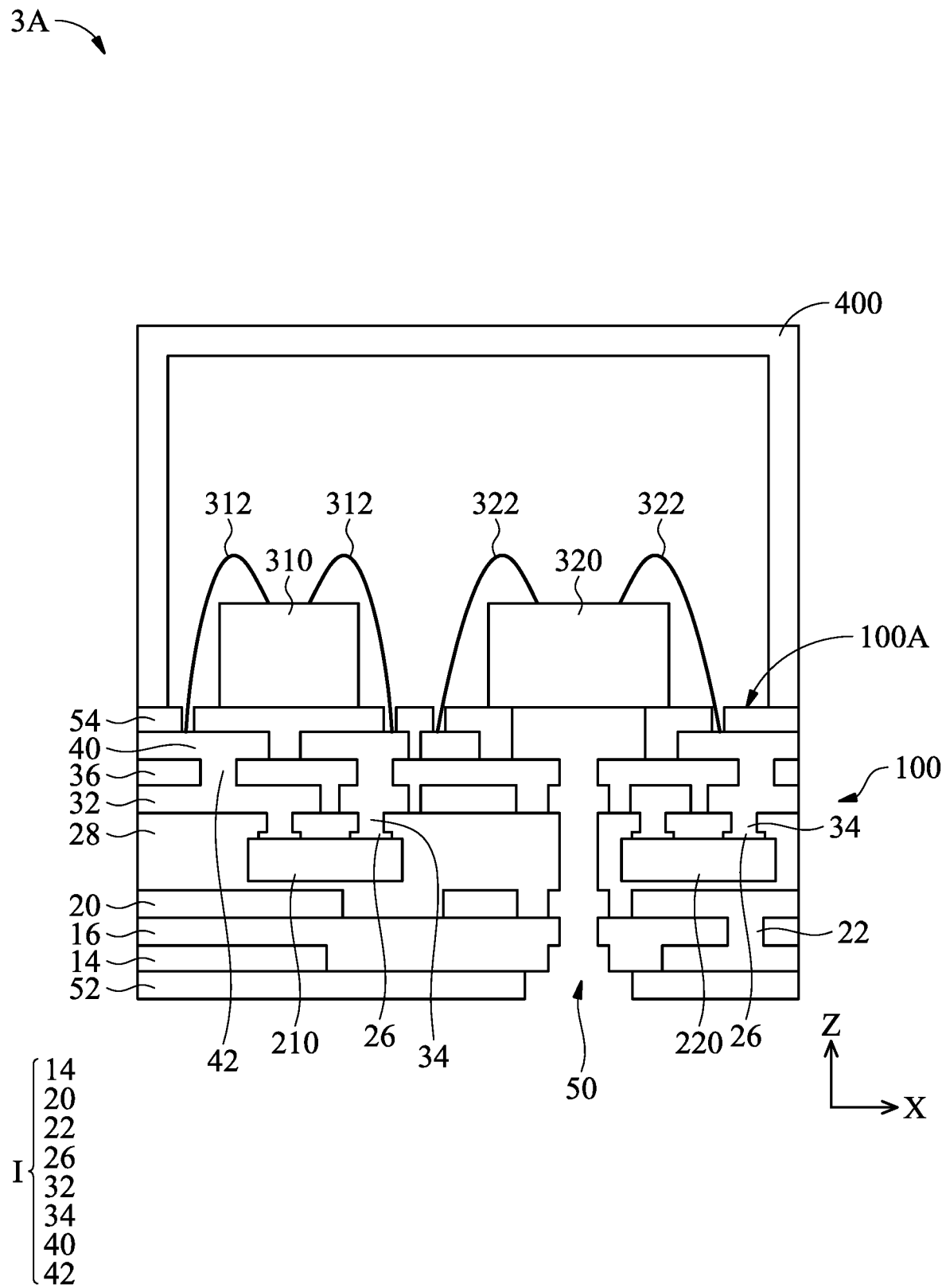
FIG. 3A is a schematic view of a sensor illustrated according to some embodiments.

A structure having a plurality of sensing elements on a single sensor is also provided in some embodiments of the present disclosure. For example, FIG. 3A is a schematic view of a sensor 3A according to an embodiment of the present disclosure. A sensing element 310 (first sensing element) and a sensing element 320 (second sensing element) are disposed on the surface 100A of the substrate 100 and are electrically connected to the interconnect structure I in the substrate 100 through wirings 312 and wirings 322, respectively. Furthermore, a chip 210 and a chip 220 are disposed in the substrate 100 and corresponding to the sensing element 310 and the sensing element 320, respectively. The sensing element 310 and the sensing element 320 are disposed on the same side of the substrate 100, and the substrate 100 includes a through hole 50 overlapping with the sensing element 320 rather than the sensing element 310 in a direction that is perpendicular to the surface 100A of the substrate 100. In other words, the through hole 50 corresponds to the sensing element 320. As a result, the sensing element 320 may be a sensing element needed to communicate with the external environment, such as an acoustic sensing element. The sensing element 310 may be a sensing element different from the sensing element 320, such as a gyroscope that does not have to directly communicate with the external environment to increase the applicability of sensor 3A.

It should be noted that the sensing element 310 is not electrically connected to the sensing element 320. In other words, the interconnect structures corresponding to the sensing element 310 and the sensing element 320 do not electrically connect with each other (the sensing element 310 is electrically connected to a first interconnect structure I1, and the sensing element 320 is electrically connected to a second interconnect structure I2) to protect their signal from interference.

Figure 3B:
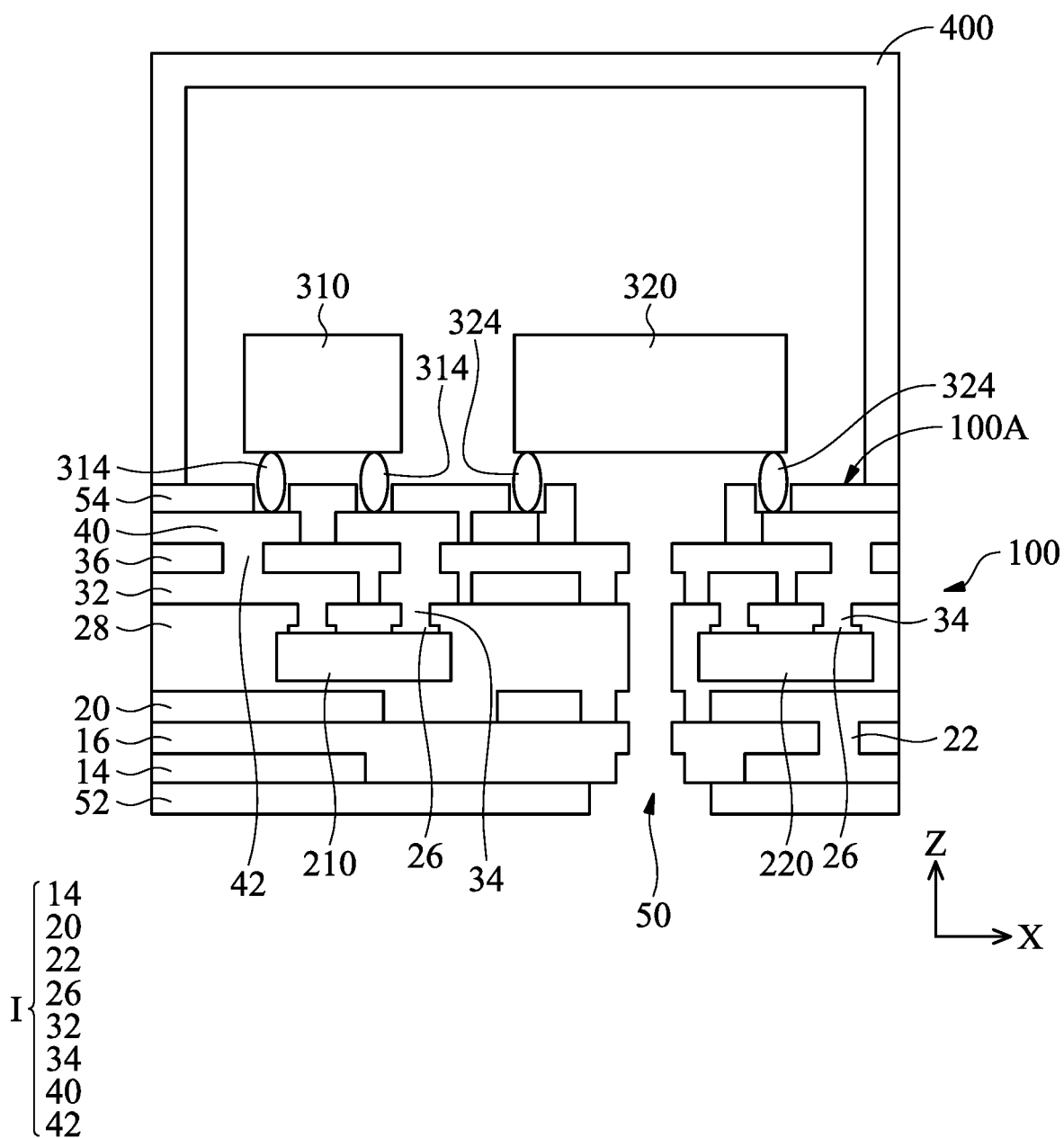
FIG. 3B is a schematic view of a sensor illustrated according to some embodiments.

In this embodiment, the sensing element 310 and the sensing element 320 are electrically connected to the interconnect structures in the substrate 100 through wirings 314 and wirings 324, respectively. However, the present disclosure is not limited thereto. For example, FIG. 3B is a schematic view of a sensor 3B in another embodiment of the present disclosure. In this embodiment, the wirings 314 may be formed between the sensing element 310 and the substrate 100, and the wirings 324 may be formed between the sensing element 320 and the substrate 100 by surface mount technology (SMT), and the sensing element 310 and the sensing element 320 may be electrically connected to their corresponding interconnect structures through the wirings 314 and the wirings 324. As a result, the efficiency of electrical connection may be enhanced.

Figure 4A:
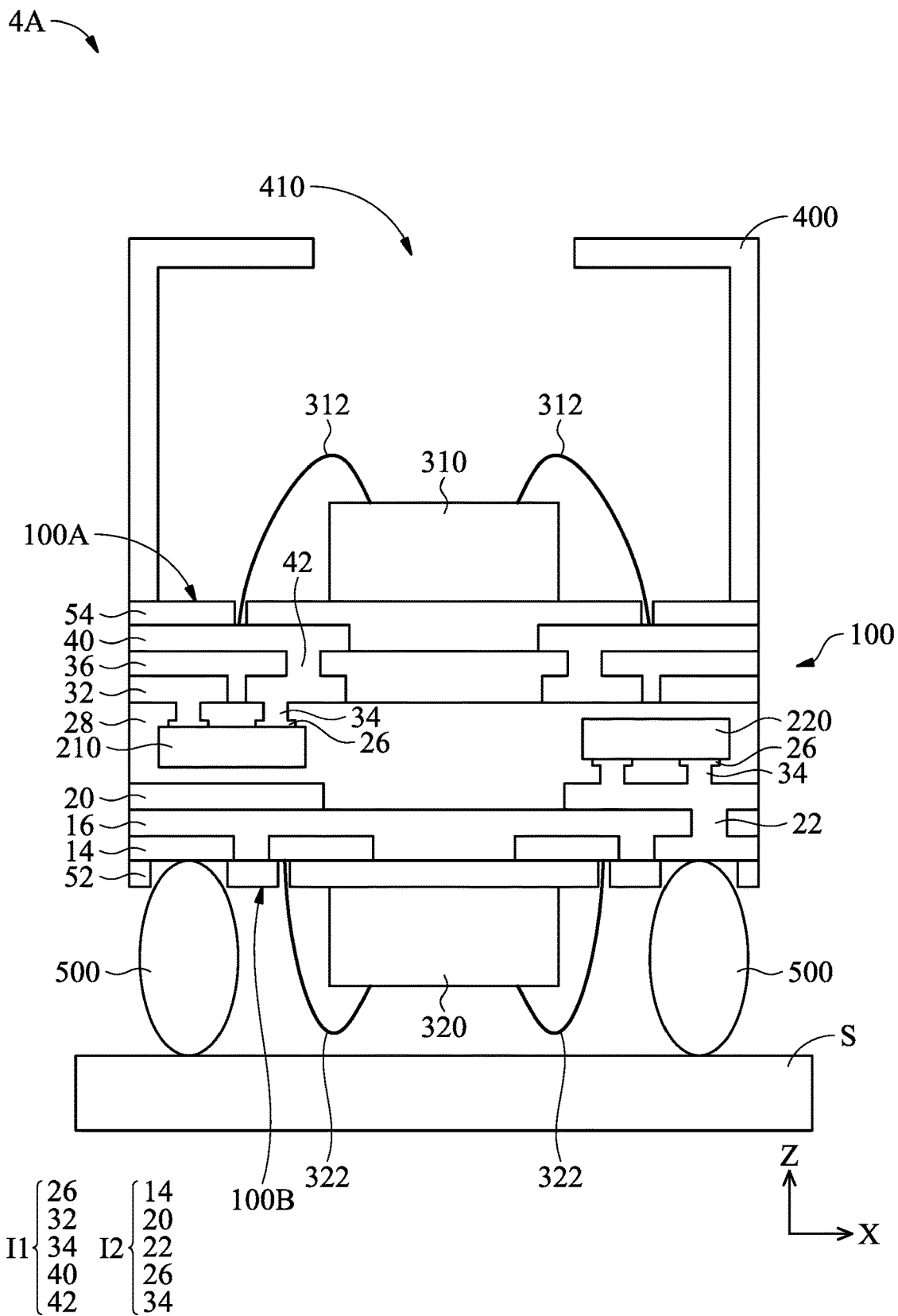
FIG. 4A is a schematic view of a sensor illustrated according to some embodiments.

Although the sensing element 310 and the sensing element 320 are disposed on the same side of the substrate 100 in the aforementioned embodiment, the present disclosure is not limited thereto. Referring to FIG. 4A, a sensor 4A of an embodiment of the present disclosure is illustrated. In this embodiment, the sensing element 310 and the sensing element 320 are disposed on opposite sides of the substrate 100. In particular, the sensing element 310 is disposed on the surface 100A of the substrate 100, and the sensing element 320 is disposed on the surface 100B of the substrate 100. Moreover, a circuit board S is formed on a surface facing the surface 100B of the substrate 100, wherein the circuit board S and the sensing element 320 are formed on the same side of the substrate. The circuit board S and the substrate 100 are electrically connected through solder balls 500, and a gap is formed between the sensing element 320 and the circuit board S in the direction that is perpendicular to the surface 100A (Z direction) instead of letting the sensing element 320 and circuit board S directly contact with each other. As a result, the sensing element 310 and the sensing element 320 may be formed on different direction to allow for different designs and applications.

Figure 4B:
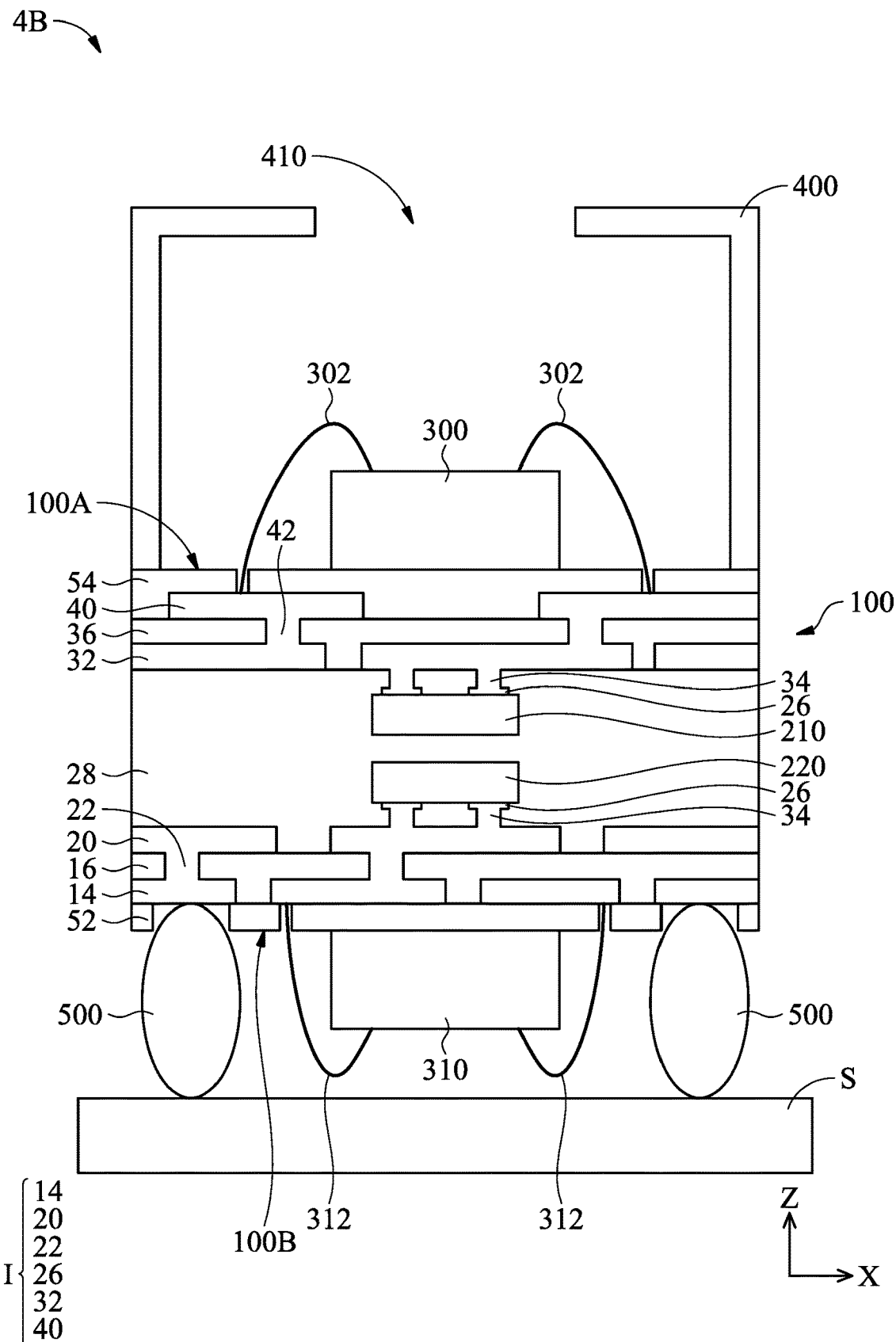
FIG. 4B is a schematic view of a sensor illustrated according to some embodiments.

In this embodiment, at least a portion of the chip 210 overlaps the chip 220 in a direction along the surface 100A (X direction). In other words, the chip 210 and the chip 220 are positioned on the same plane substantially parallel to the surface 100A to reduce the size of the sensor 4A in the direction that is perpendicular to the substrate 100 (Z direction) and to allow the sensor 4A to achieve miniaturization in applications having higher thickness requirements. However, the present disclosure is not limited thereto. For example, FIG. 4B is a schematic view of a sensor 4B according to an embodiment of the present disclosure. In FIG. 4B, at least a portion of the chip 210 overlaps the chip 220 in the direction that is perpendicular to the substrate 100 (Z direction). As a result, various sensing elements and chips may be disposed on the direction that is perpendicular to the substrate 100 (Z direction), so the dimension of the sensor 4B in a direction parallel to the substrate 100 (in the XY plane) may be reduced to allow the sensor 4B to achieve miniaturization in applications with lower thickness requirements.

Although the two chips respectively correspond to two sensing elements in the aforementioned embodiment, the present disclosure is not limited thereto. For example, a chip corresponds to two sensing elements may be disposed in the substrate 100 to reduce the cost and space occupied.

Figure 5A:
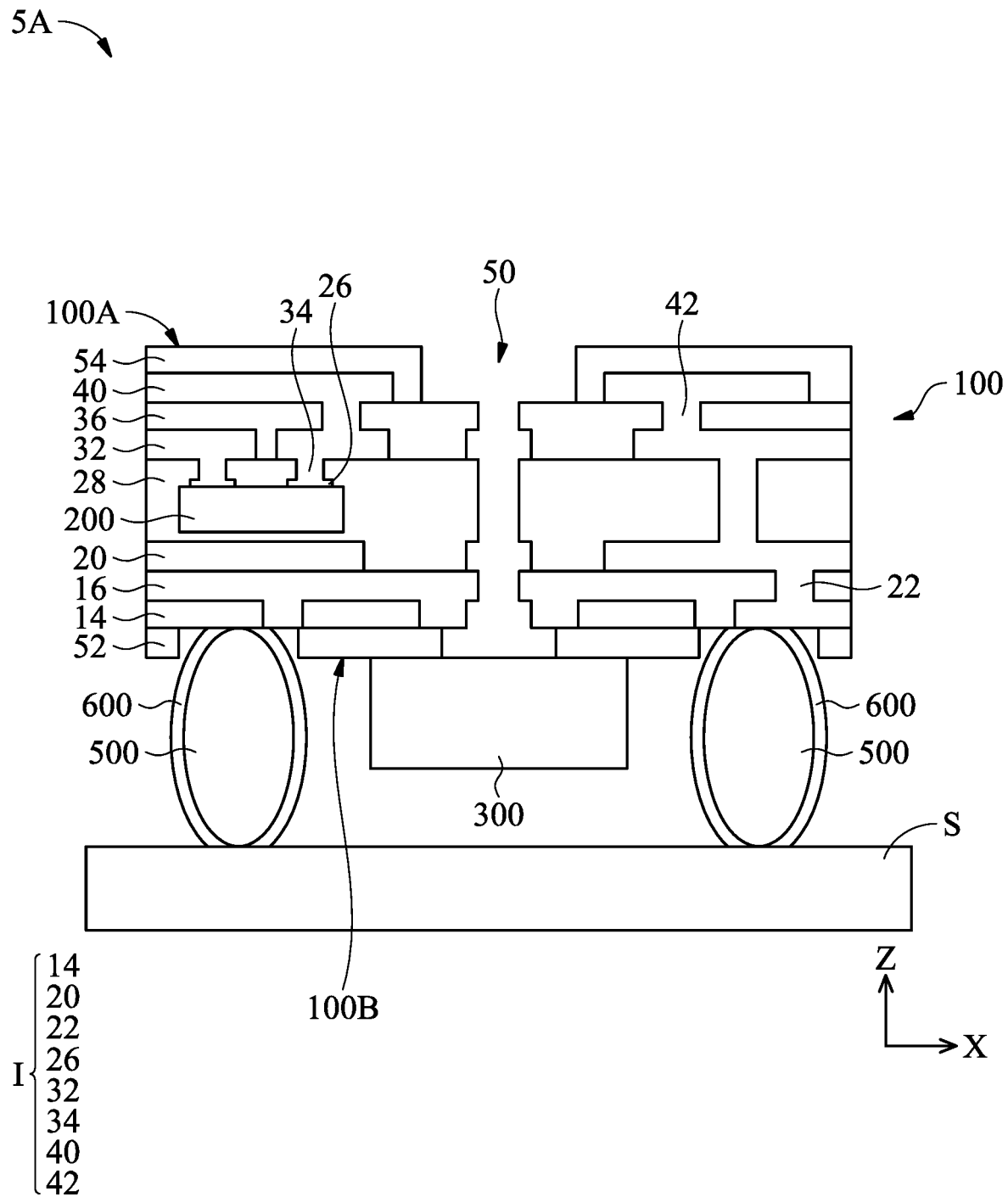
FIG. 5A is a schematic view of a sensor illustrated according to some embodiments.

Referring to FIG. 5A, a sensor 5A according to an embodiment of the present disclosure is illustrated. Sealing material 600 is formed between the substrate 100 and the circuit board S of the sensor 5A, and a portion of the through hole 50 overlaps the sensing element 300 in the direction that is perpendicular to the surface 100A (Z direction). As a result, the sensing element 300 may communicate with the external environment through the through hole 50 to increase the sensing effect of the sensing element 300.

Figure 5B:
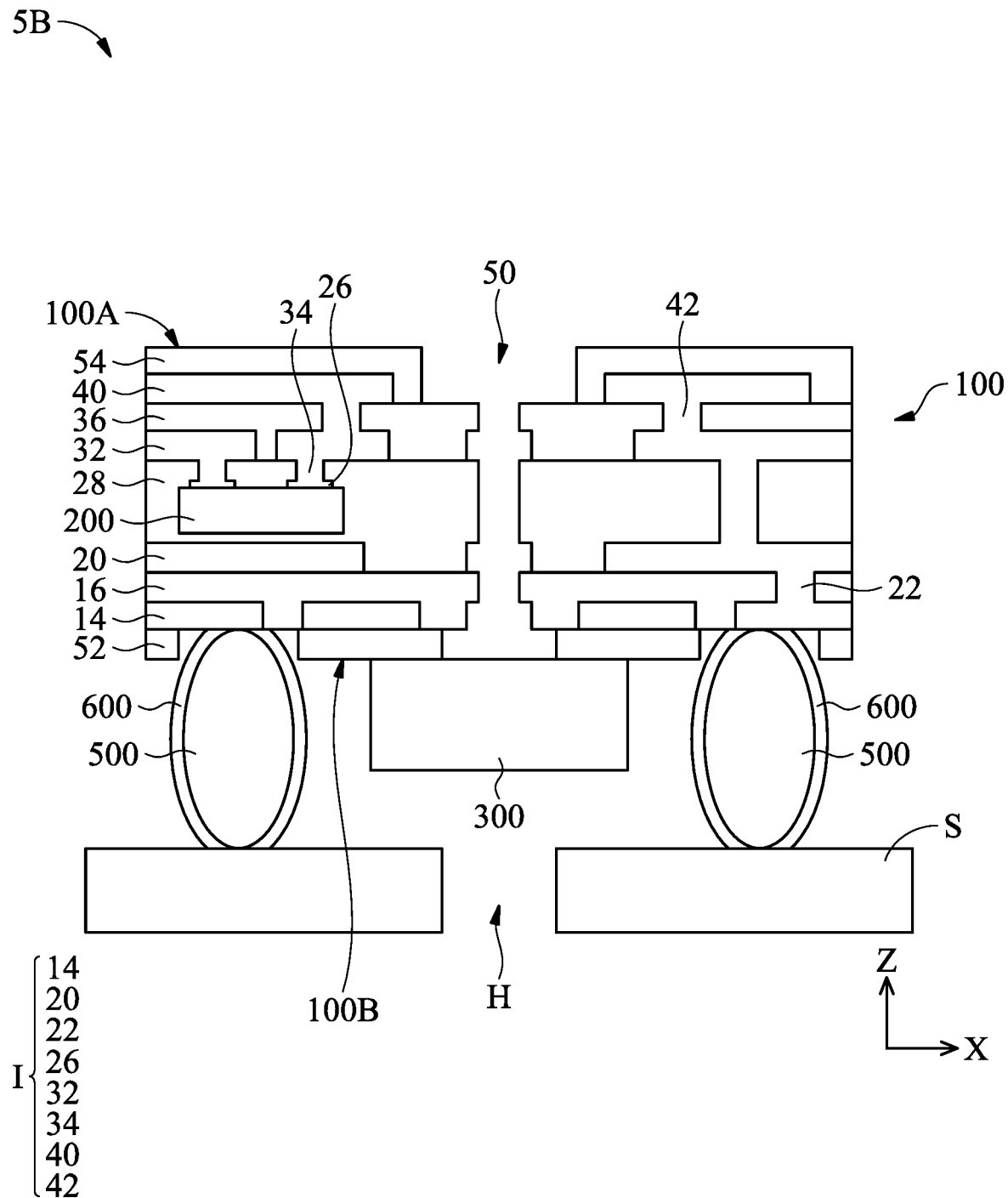
FIG. 5B is a schematic view of a sensor illustrated according to some embodiments.

Furthermore, in some embodiments, a hole may be formed on the circuit board S to further enhance the sensing effect of the sensing element. For example, FIG. 5B illustrates a sensor 5B of an embodiment of the present disclosure. The circuit board S in FIG. 5H has a hole H to allow the sensing element 300 to perform a sensing function through the hole H on the circuit board S, so that design freedom may be enhanced. Furthermore, in the direction that is perpendicular to the surface 100A (Z direction), a portion of the hole H overlaps the sensing element 300. In other words, the hole H corresponds the position of the sensing element 300. As a result, the distance between the hole H and the sensing element 300 may be reduced to enhance the sensing effect of the sensing element 300. Furthermore, in this embodiment, the sealing material 600 covers the hole H. As a result, the sensing element 300 outside the substrate 100 may be further protected from external interference. Moreover, although the through hole 50 and the hole H are provided in this embodiment at the same time, the present disclosure is not limited thereto. For example, it is also available forming the hole H in the circuit board S without forming the through 50 in the substrate 100, depending on design requirements.

Figure 6:
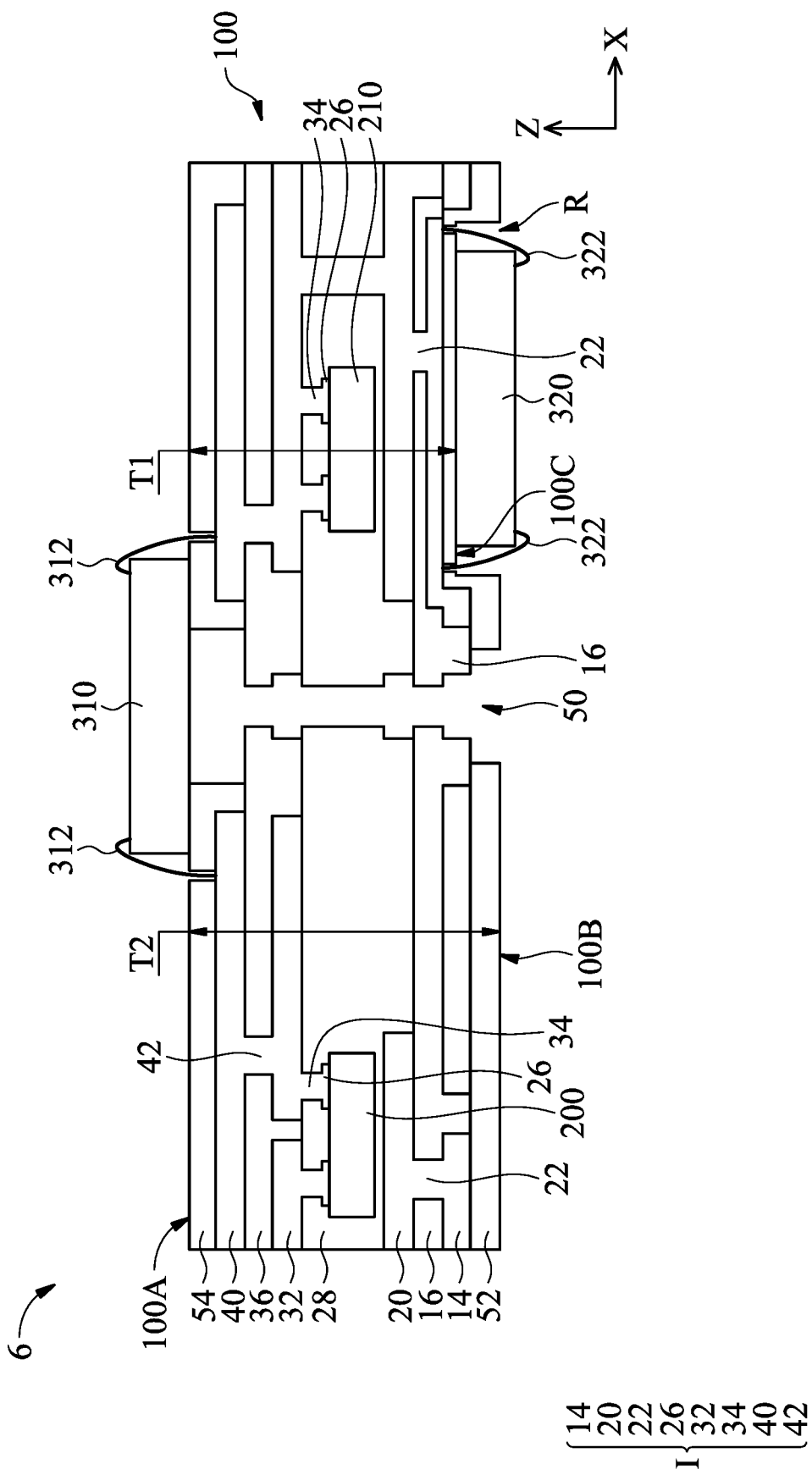
FIG. 6 is a schematic view of a sensor illustrated according to some embodiments.

In the aforementioned embodiment, the thicknesses of the substrate 100 where the sensing element 310 and the sensing element 320 are positioned are identical, but the present disclosure is not limited thereto. For example, FIG. 6 is a schematic view of a sensor 6 in an embodiment of the present disclosure. In FIG. 6, the thickness of a portion of the substrate may be reduced to form a recess R on the substrate 100, and the sensing element 320 may be positioned in the recess R (i.e. disposed on a surface 100C of the substrate 100) to further reduce the dimension of the sensor 6. In particular, the substrate 100 has a thickness T1 at where the sensing element 320 is positioned (i.e. the distance between the surface 100A and the surface 100C) and a thickness T2 at where the sensing element 320 is not positioned (i.e. the distance between the surface 100A and the surface 100B), and T2>T1. As a result, in this embodiment, the thickness of the insulating layer 16 is decreased to reduce the thickness of the substrate 100, so the dimension of the sensor 6 may be reduced. However, the present disclosure is not limited thereto. For example, in some embodiments, the thickness of the insulating layer 28 or the insulating layer 40 may also be reduced to achieve the same result, depending on design requirements. Furthermore, in this embodiment, the sensing element 310 and the sensing element 320 may be disposed on opposite sides of the substrate 100, and a through hole 50 partially overlaps to the sensing element 310 along the Z direction may be formed in the substrate 100 to achieve similar advantages in aforementioned embodiments.

Figure 7:
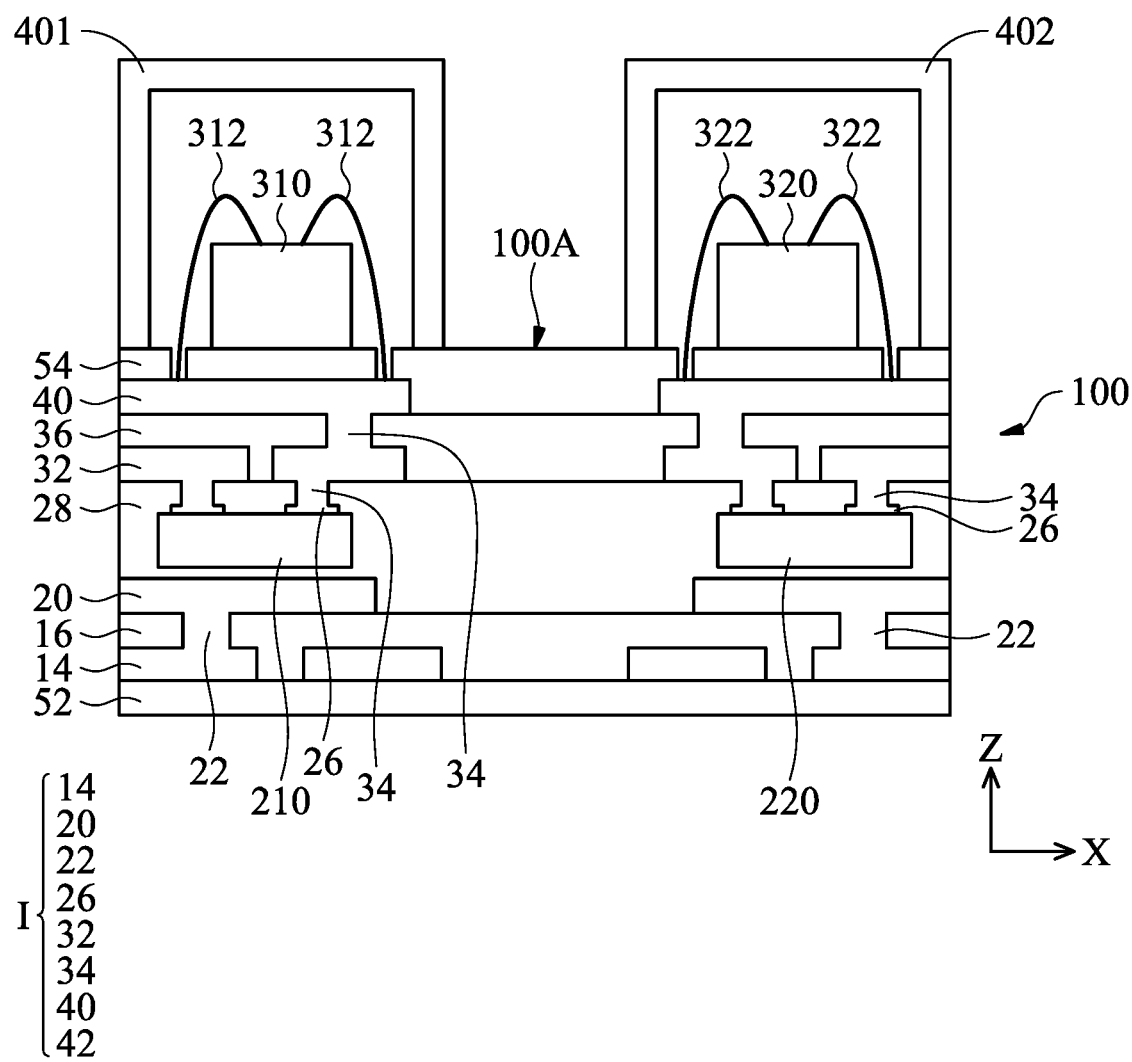
FIG. 7 is a schematic view of a sensor illustrated according to some embodiments.

Referring to FIG. 7, a sensor 7 in an embodiment of the present disclosure is illustrated. In the sensor 7, the sensing element 310 and the sensing element 320 are disposed on the same side of the substrate 100 (on the surface 100A). Furthermore, the sensor 7 further includes two cases (i.e. a case 410 (first case) and a case 420 (second case)), the sensing element 310 is positioned in a space formed from the substrate 100 and the case 410, and the sensing element 320 is positioned in a space formed from the substrate 100 and the case 420. The two sensing elements may be prevented from being interfered with by positioning the sensing element 310 and the sensing element 320 in different spaces. Furthermore, in this embodiment, the sensing element 310 (the first sensing element) and the sensing element 320 (the second sensing element) correspond to the chip 210 (the first chip) and the chip 220 (the second chip), respectively. In other words, the sensing element 310 partially overlaps the chip 210 in the direction that is perpendicular to the surface 100A (Z direction), and the sensing element 320 partially overlaps the chip 220 in the direction that is perpendicular to the surface 100A (Z direction) to reduce the distance between the sensing elements and the chips for increasing efficiency.

Figure 8:
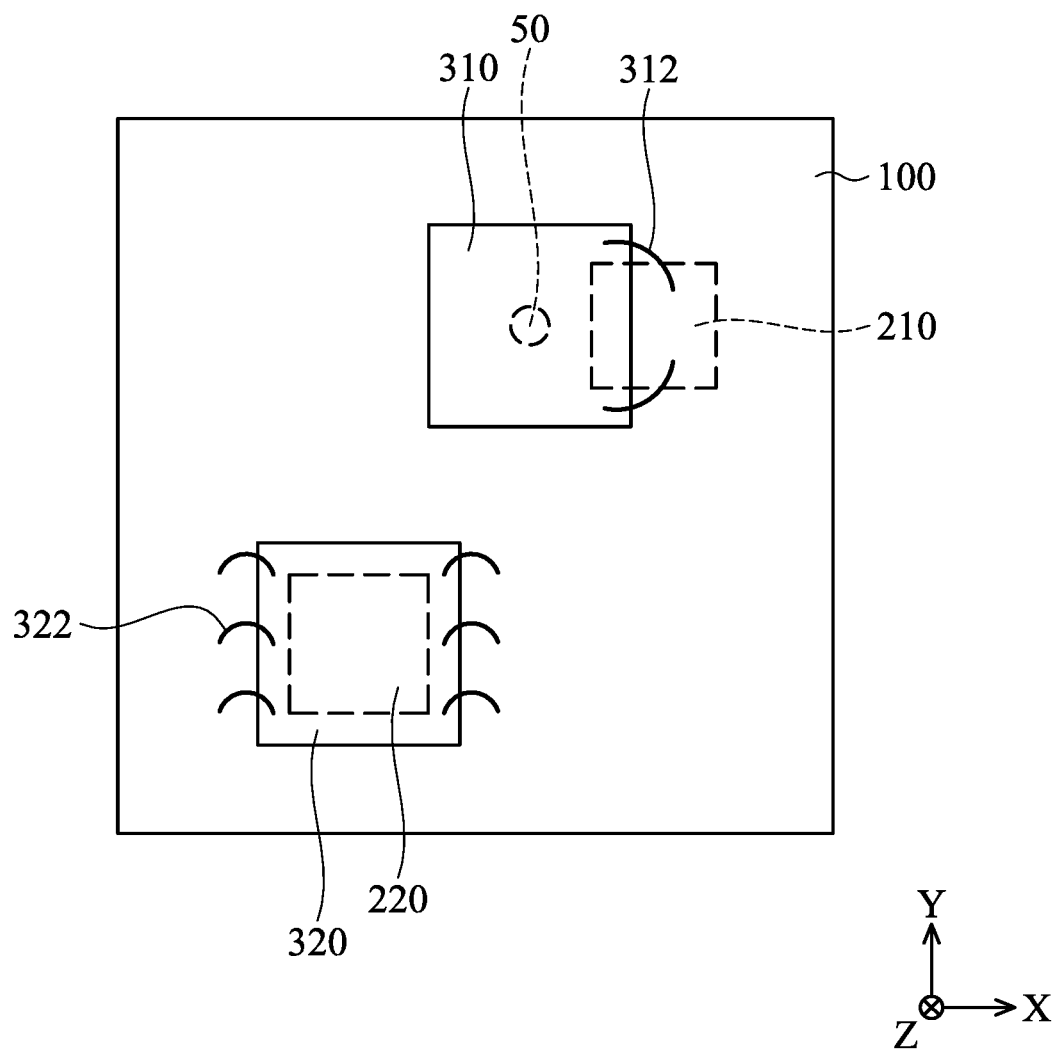
FIG. 8 is a top view of a sensor illustrated according to some embodiments of the present disclosure.

The configuration of two sensing elements positioned on the same substrate of the sensor is described. FIG. 8 is a top view of a sensor according to some embodiments of the present disclosure. In FIG. 8, the chip 210 and the chip 220 are embedded in the substrate 100, so they are illustrated by dashed lines. The sensing element 310 is disposed on the through hole 50 (partially overlap with each other in Z direction), and is electrically connected to the chip 210 through the wirings 312 and the interconnect structure (not shown) in the substrate 100. The sensing element 320 may partially overlaps to the chip 220 in the Z direction (the direction that is perpendicular to the substrate 100), and is electrically connected to the chip 220 through the wirings 322 and the interconnect structure (not shown) in the substrate 100.

Figure 9:
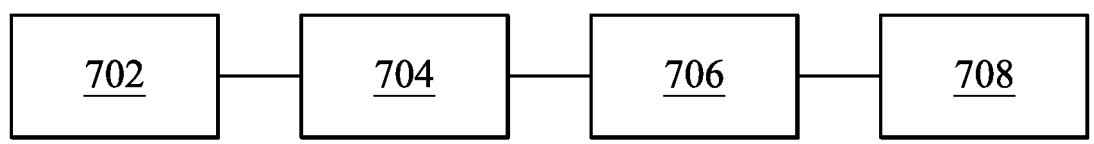
FIG. 9 is a schematic view of a sensor illustrated according to some embodiments of the present disclosure.

FIG. 9 is s schematic view of an electronic system 700 in an embodiment of the present disclosure. The electronic system 700 mainly includes a power supply element 702, a filtering element 704, a chip 706 and a sensing element 708. The power supply element 702 may be a suitable element for providing power such as a power managing IC, etc., and the power supply element 702 is electrically connected to the filtering element 704. Noise is contained in the current provided by the power supply element 702, so it is required to filter the noise generated from the power supply element 702 by the filtering element 704. The filtering element 704 may be an element which can filter noise, such as a capacitor, etc. Afterwards, the filtering element 704 is electrically connected to the chip 706, and the chip 706 is connected to the sensing element 708 to provide energy that the chip 706 and the sensing element 708 required during operation.

Figures 10A, 10B, 10C:
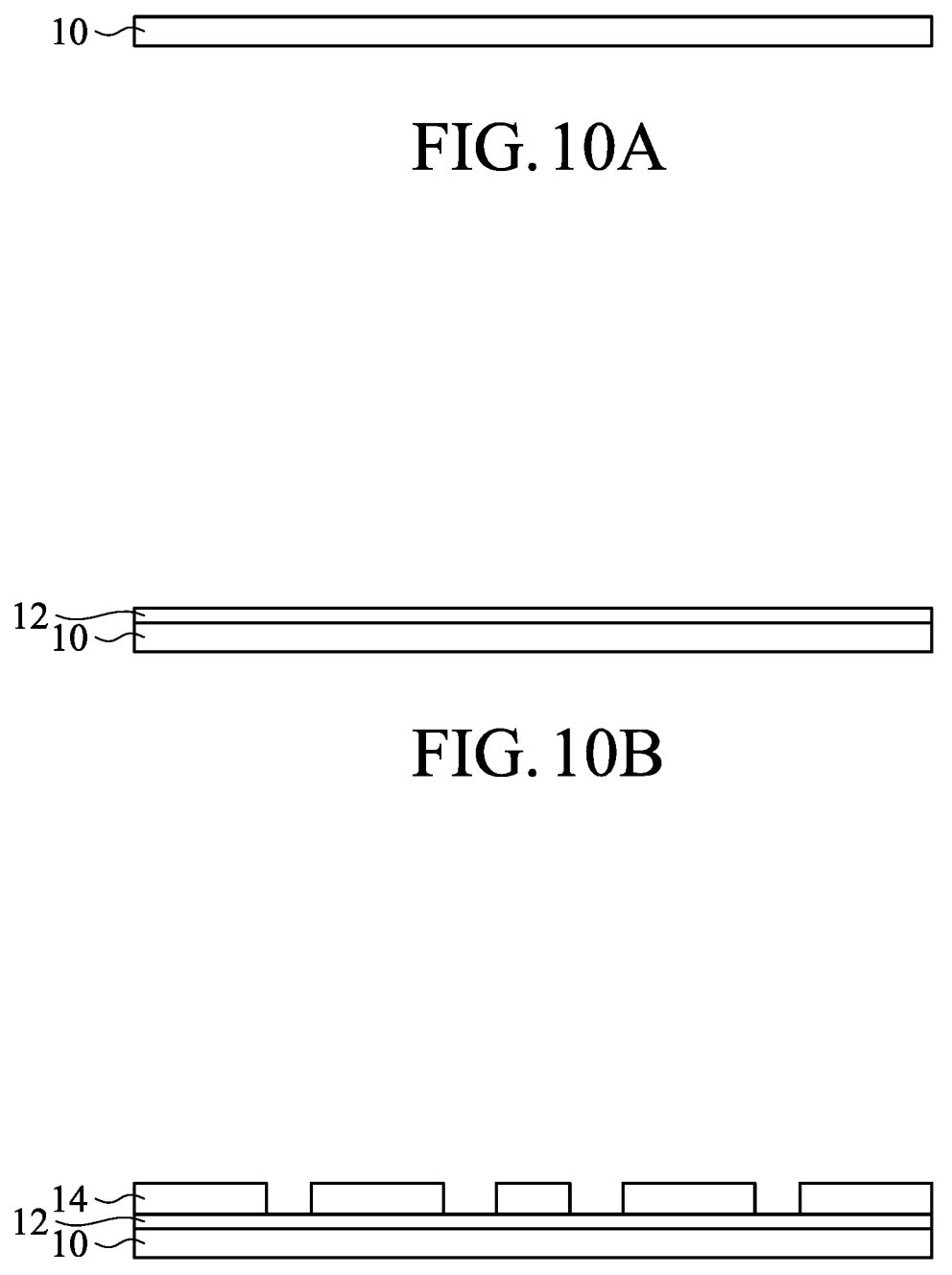
Figure 10D:
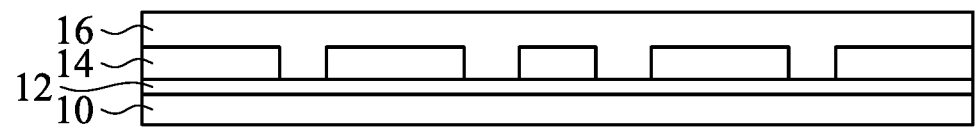
FIGS. 10A to 10V illustrate the steps of forming a substrate having a through hole and a chip.
Figure 10E:
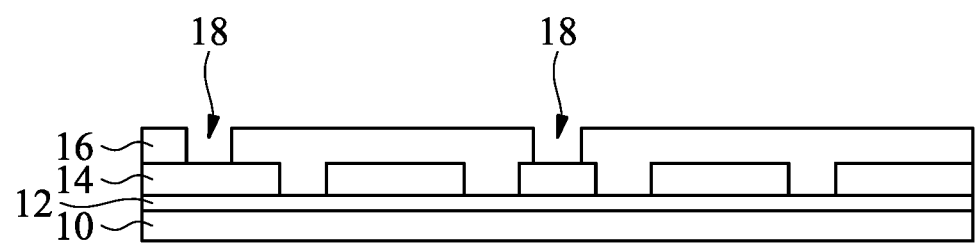
Figure 10F:
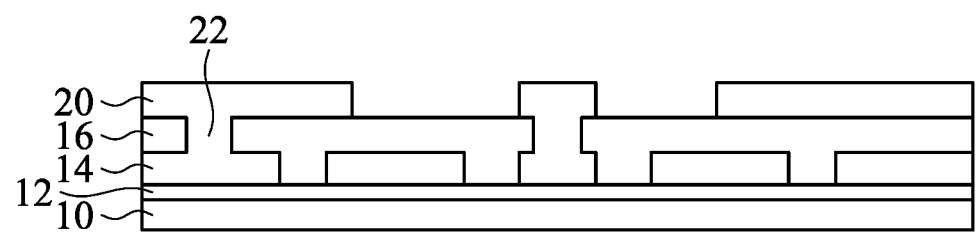
Figure 10G:
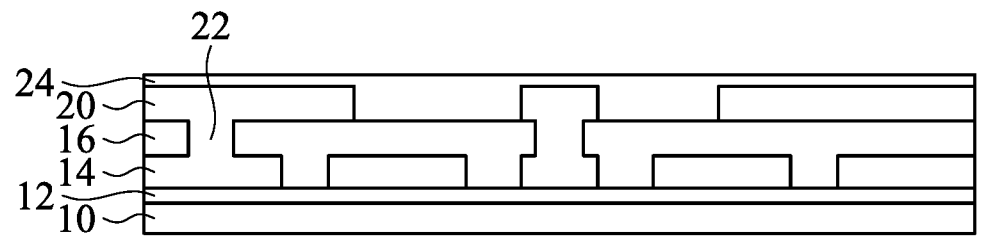
Figure 10H:
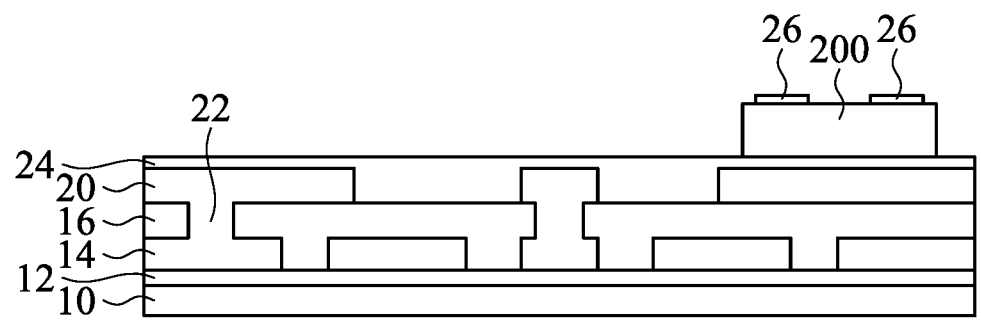
Figure 10I:
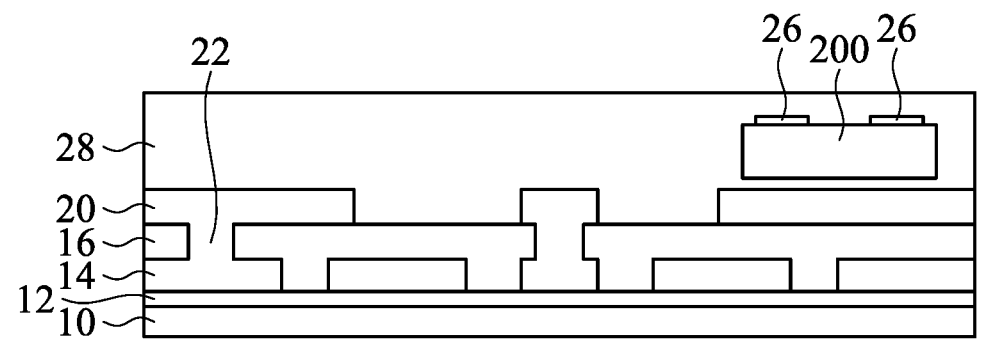
Figure 10J:
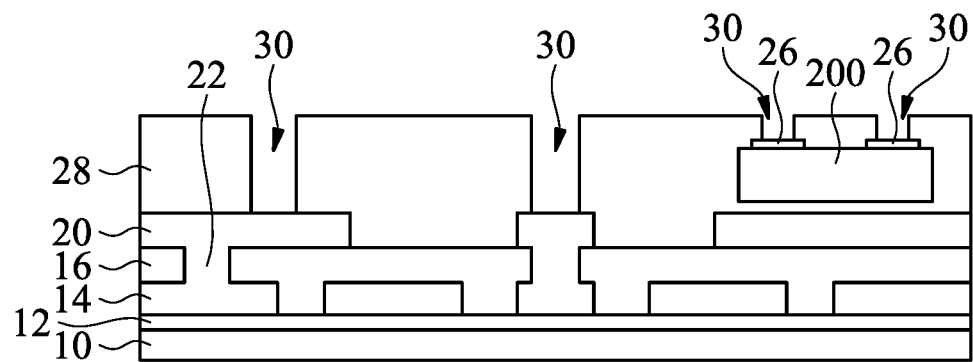
Figure 10K:
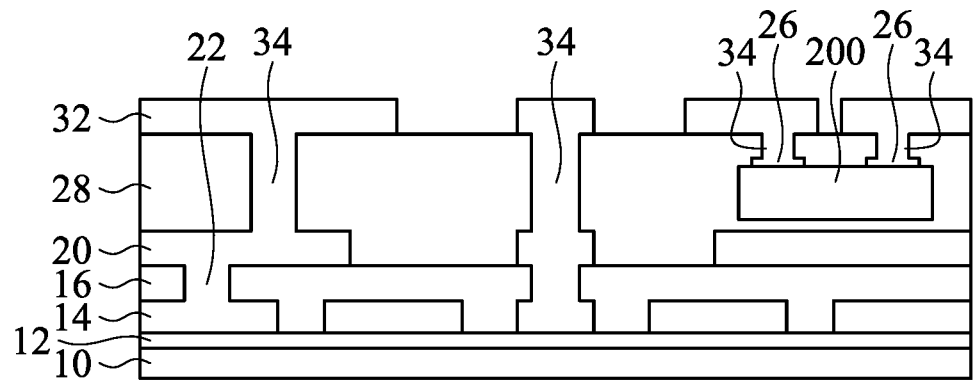
Figure 10L:
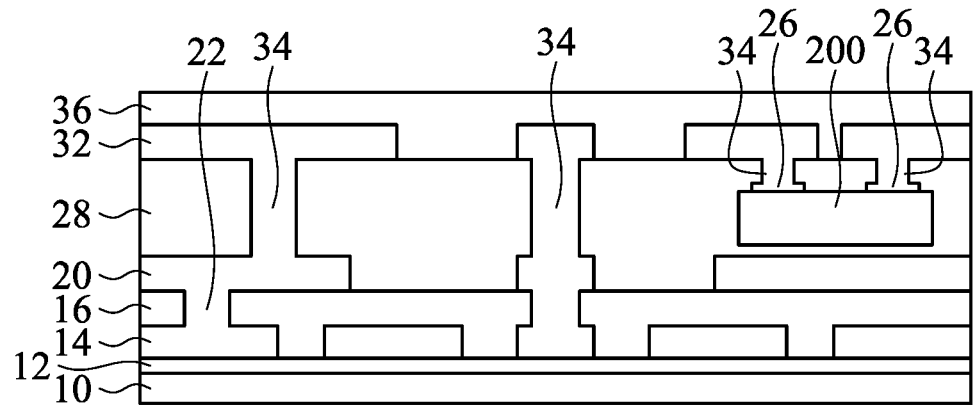
Figure 10M:
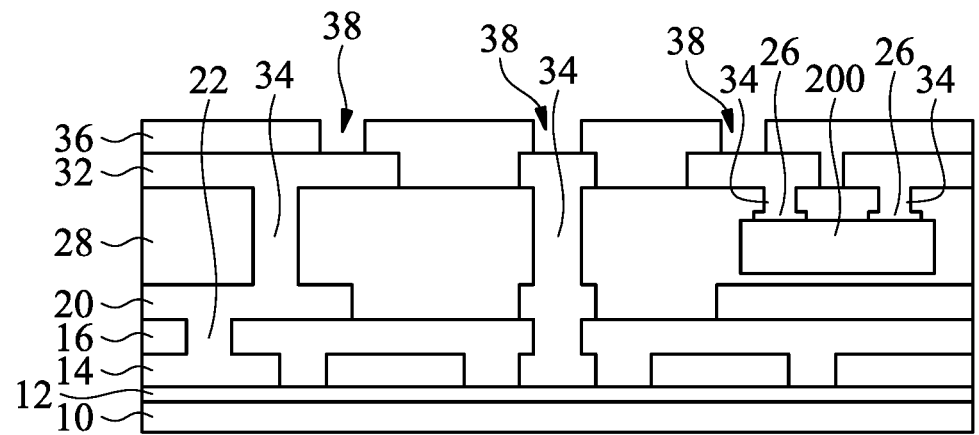
Figure 10N:
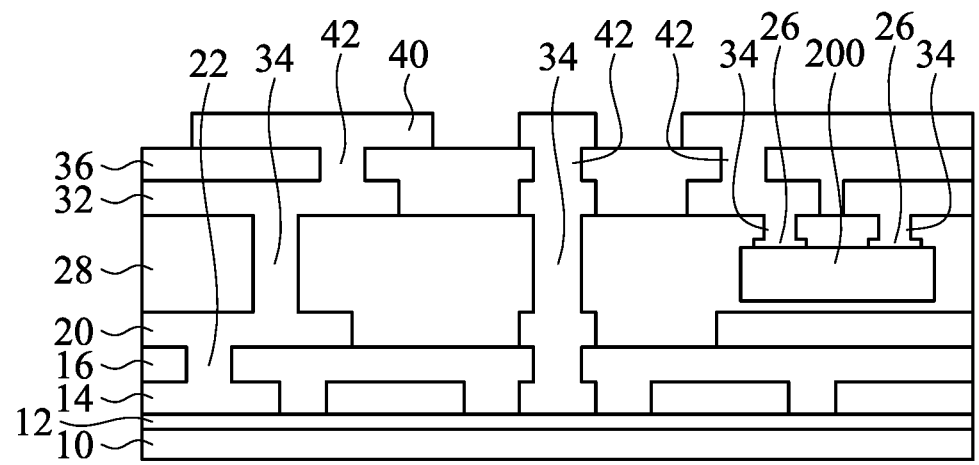
Figure 10O:
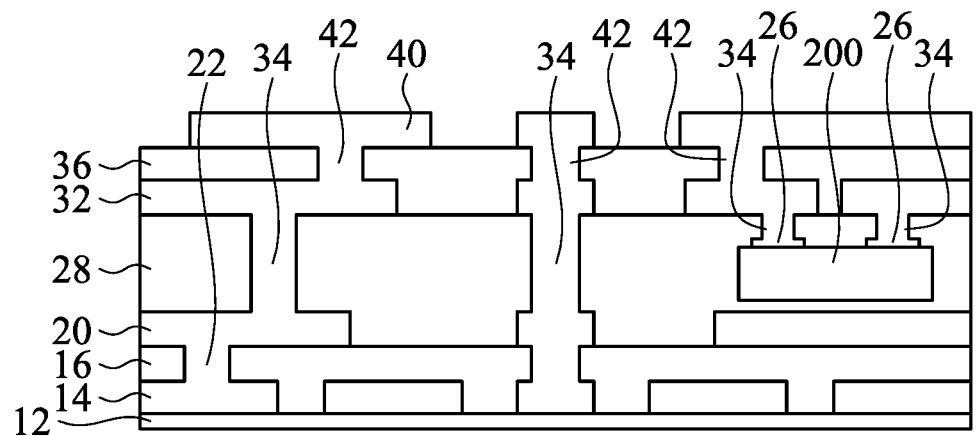
Figure 10P:
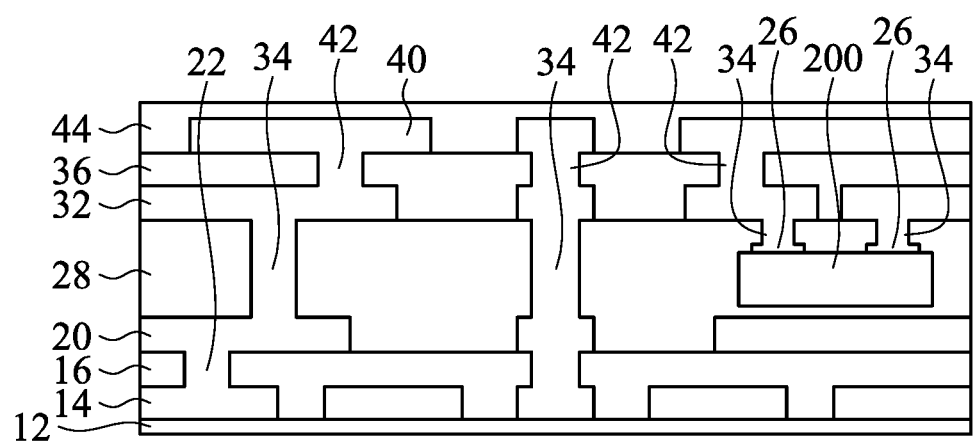
Figure 10Q:
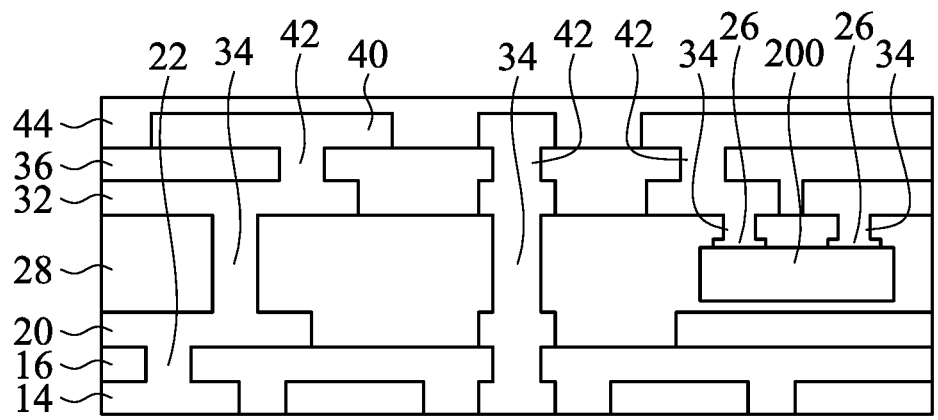
Figure 10R:
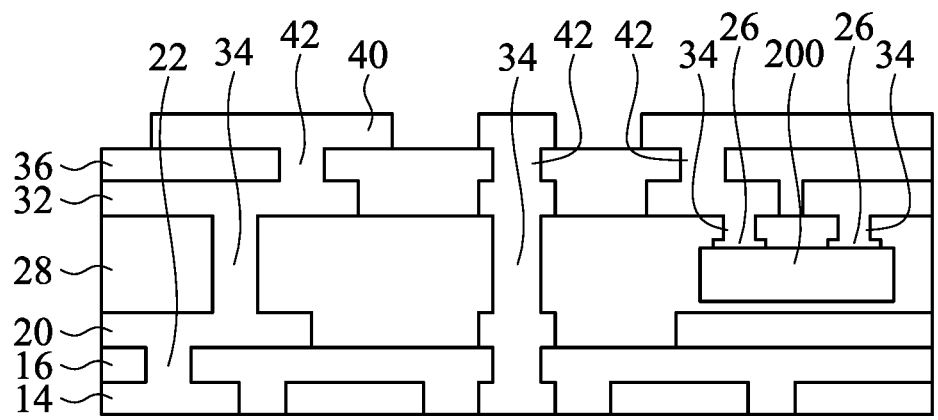
Figure 10S:
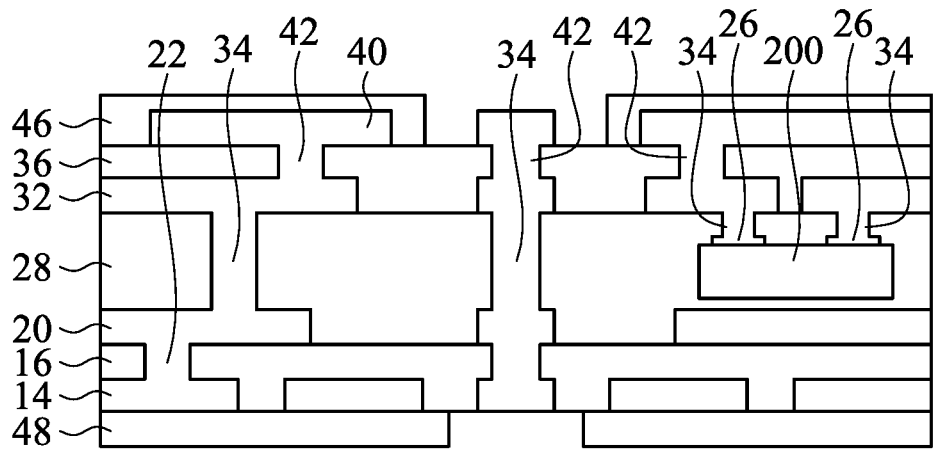
Figure 10T:
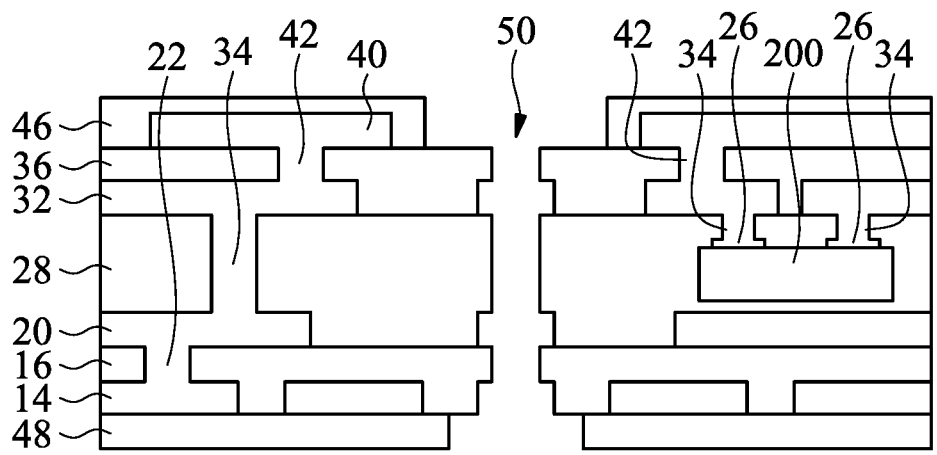
Figure 10U:
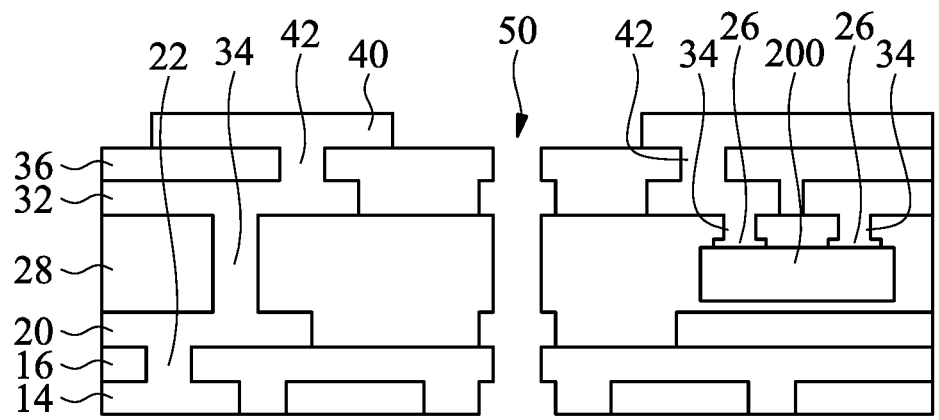
Figure 10V:
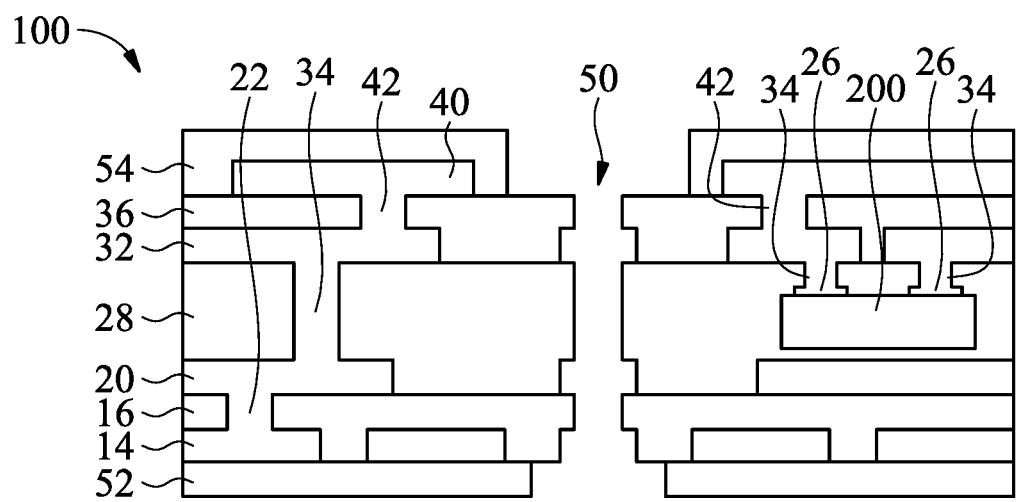

Referring to FIGS. 10A to 10V, steps for forming the substrate 100 having the through hole 50 and the chip 200 are illustrated. In FIG. 10A, a carrier plate 10 is provided. The carrier plate 10 may include suitable metal carrier plate (e.g. stainless steel). Afterwards, a coreless carrier plate process may be performed for manufacturing. In FIG. 10B, a conductive layer 12 is provided on the carrier plate 10 to be a buffer of the subsequent processes. The conductive layer 12 may include suitable metal materials and may be formed by plating (e.g. electroplating or chemical plating).

In FIG. 10C, a patterned wiring layer 14 is formed on the conductive layer 12. The wiring layer 14 may withstand laser used in the subsequent processes (i.e. may be a buffer). It should be noted that the processes for forming the wiring layer 14 include suitable deposition and patterning processes to allow a portion of the conductive layer 12 to be exposed from the wiring layer 14 in FIG. 10C. In FIG. 10D, an insulating layer 16 is provided on the conductive layer 12 and the wiring layer 14. The insulating layer 16 may be dielectric material (e.g. resin, etc.) having glass fibers, and may be combined with the conductive layer 12 and the wiring layer 14 by pressing.

In FIG. 10E, holes 18 are formed on the insulating layer 16 by laser etching drilling process. It should be noted that the holes 18 are formed on the wiring layer 14 to prevent the conductive layer 12 being affected during the laser etching drilling process, so the conductive layer 12 may be prevented from being damaged.

Afterwards, in FIG. 10F, conductive material is disposed on the insulating layer 16 and the holes 18 to form a wiring layer 20 and vias 22, respectively. The wiring layer 20 is formed on the insulating layer 16, and the vias 22 are formed in the holes 18. The wiring layer 20 and the vias 22 may be formed from suitable deposition processes.

Afterwards, in FIG. 10G, an insulating layer 24 is formed on the wiring layer 20. The material of the insulating layer 24 may be dielectric material (e.g. resin) that different from the insulating layer 16, and the insulating layer 24 may be combined with other structures by pressing. In FIG. 10H, the chip 200 is disposed on the insulating layer 24, and conductive pads 26 may be disposed on the chip 200 to provide electrical connection between the chip 200 and the interconnect structure formed later. In FIG. 10I, additional dielectric material is disposed to form an insulating layer 28 together with the insulating layer 24 in FIG. 10H for covering the whole chip 200 and being fixed with each other by pressing.

In FIG. 10J, holes 30 are formed at where the wiring layer 20 and the conductive pads 26 are positioned and are formed by laser etching drilling process. In other words, the holes 30 partially overlap the wiring layer 20 or the conductive pads 26 in a direction that is perpendicular to the carrier plate 10. It should be noted that a portion of the wiring layer 14, the wiring layer 20, the vias 22 and the holes 30 overlap with each other in the direction that is perpendicular to the carrier plate 10. Afterwards, in FIG. 10K, conductive material is provided on the insulating layer 28 and in the holes 30 (FIG. 10J) to formed wiring layer 32 and vias 34, respectively. It should be noted that a portion of the wiring layer 14, the wiring layer 20, the vias 22, the wiring layer 32 and the vias 34 overlap with each other in the direction that is perpendicular to the carrier plate 10. In FIG. 10L, an insulating layer 36 is provided on the wiring layer 32 and is combined with the aforementioned structures by pressing. The material of the insulating layer 36 may be a resin material similar or identical to the material of the insulating layer 16, such as FR-4 or bismaleimide triazine (BT), and glass fibers mat be included in the insulating layer 36.

Afterwards, in FIG. 10M, holes 38 are formed in the insulating layer 36 and correspond to the wiring layer 32 (i.e. in the direction that is perpendicular to the carrier plate 10, the holes 38 and the wiring layer 32 partially overlap with each other). In FIG. 10N, wiring layer 40 and vias 42 are formed on the insulating layer 36 and in the holes 38 (FIG. 10M), respectively. The processes for forming the wiring layer 40 and the vias 42 may include suitable deposition processes. It should be noted that a portion of the wiring layer 14, the wiring layer 20, the vias 22, the wiring layer 32, the vias 34, the wiring layer 40 and the vias 42 overlap with each other in the direction that is perpendicular to the carrier plate 10. In FIG. 10O, the carrier plate 10 is removed. In FIG. 10P, a layer of protective layer 44 is formed on the wiring layer 40. The protective layer 44 may be disposed on the structure by lamination process, and the process for forming the protective layer 44 may include exposure process.

In FIG. 10Q, the conductive layer 12 is removed and may be removed by suitable etching processes. At the same time, the protective layer 44 may protect the insulating layer 36, wiring layer 40, etc. under the protective layer 44 from being affect by the etching process for removing the conductive layer 12. Afterwards, in FIG. 10R, the protective layer 44 is removed. In FIG. 10S, a protective layer 46 and a protective layer 48 are disposed on opposite sides of the aforementioned structure. It should be noted that a portion of the wiring layer 14, the wiring layer 20, the vias 22, the wiring layer 32, the vias 34, the wiring layer 40 and the vias 42 overlap with each other in the direction that is perpendicular to the carrier plate 10 do not covered by the protective layers 46 and 48. In FIG. 10T, the portion that does not covered by the protective layers 46 and 48 is etched to remove a portion of the wiring layers 14, 20, 32, 40 and the vias 22, 34, 42 to form a through hole 50.

In FIG. 10U, the protective layers 46 and 48 are removed. Finally, in FIG. 10V, the substrate 100 is formed by forming passivation layers 52 and 54 on opposite sides of the aforementioned structure. As a result, the substrate 100 having the through hole 50 may be formed by the processes shown in FIGS. 10A to 10V, and the chip 200 may be embedded in the substrate 100 to achieve the aforementioned advantages. Furthermore, the wiring layers 14, 20, 32, 40, the vias 22, 34, 42 and the conductive pads form an interconnect structure embedded in the substrate 100.

Figure 11A:
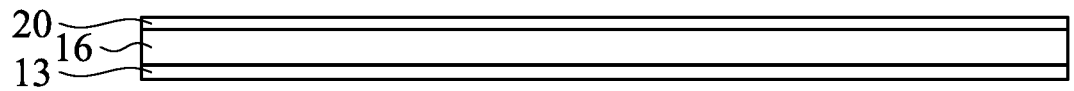
FIGS. 11A to 11Q illustrate the steps of forming a substrate having a capacitor.
Figure 11B:
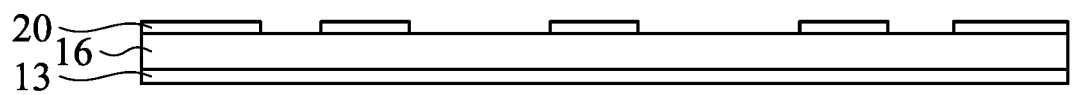
Figure 11C:
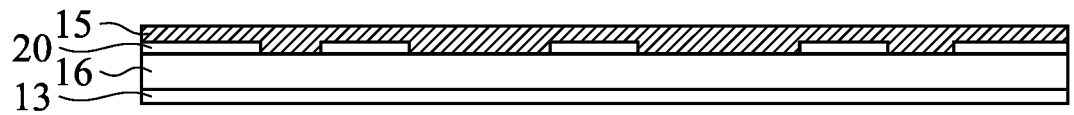

A method for embedding other elements in a substrate is provided in other embodiments of the present disclosure. For example, referring to FIGS. 11A to 11Q, steps for forming a substrate 100 having a capacitor C are illustrated. First, in FIG. 11A, a protective layer 13, an insulating layer 16 and a wiring layer 20 are provided sequentially. Afterwards, in FIG. 11B, the wiring layer 20 is patterned to form a patterned wiring layer 20. In FIG. 11C, a dielectric layer 15 is formed on the patterned wiring layer 20. The method for forming the dielectric layer 15 may include suitable deposition processes, and the dielectric layer 15 may be, for example, resin material.

Figure 11D:
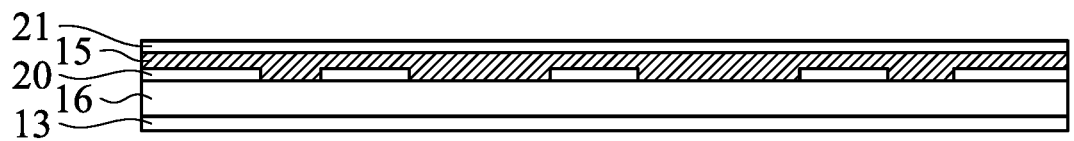
Figure 11E:
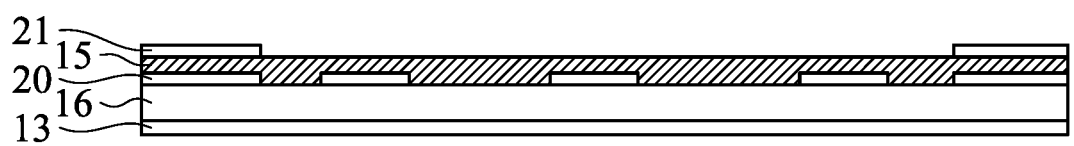
Figure 11F:
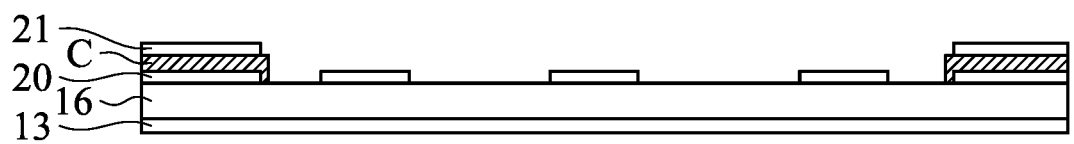

Afterwards, in FIG. 11D, a wiring layer 21 is formed on the dielectric layer 21. The process and material of the wiring layer 21 may be identical or similar to that of the wiring layer 20, and is not repeated. In FIG. 11E, the wiring layer 21 is patterned for removing a portion of the wiring layer 21. It should be noted that at least a portion of the patterned wiring layer 21 overlaps the patterned wiring layer 20 in a direction that is perpendicular to the insulating layer 16. In FIG. 11F, a portion of the dielectric layer 15 and the wiring layer 20 are removed by, for example, etching and patterning. It should be noted that the dielectric layer 15 between the wiring layer 20 and the wiring layer 21 is not removed, forms a capacitor C and acts as a portion of the interconnect structure in the substrate of the present embodiment. For example, other suitable materials may be disposed to form other elements (e.g. passive elements such as resistor, inductor, etc.) between the wiring layers 20 and 21, depending on design requirements. Furthermore, it is allowed that a portion of the wiring layer 20 does not cover by the capacitor C and the wiring layer 21.

Figure 11G:
Figure 11H:
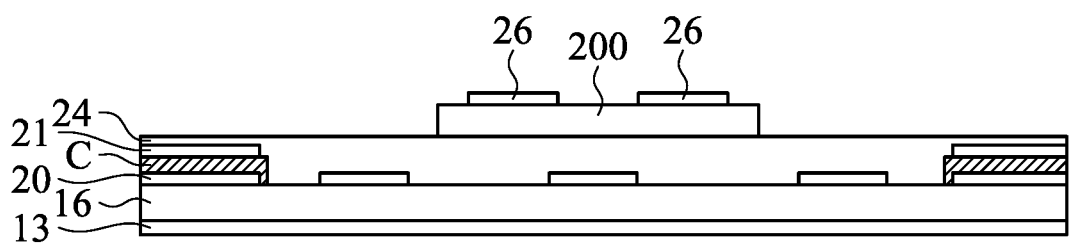
Figure 11I:
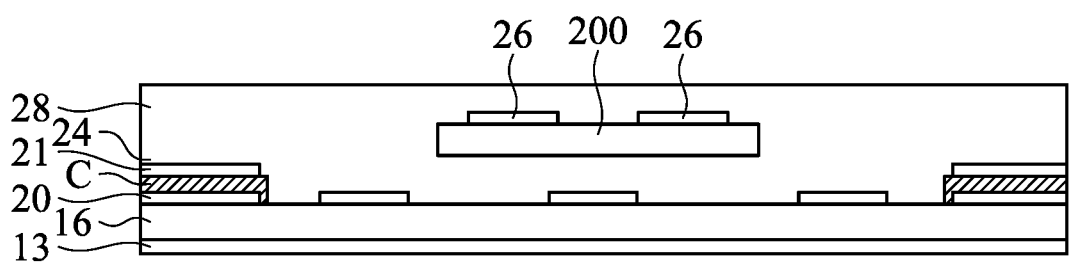
Figure 11J:
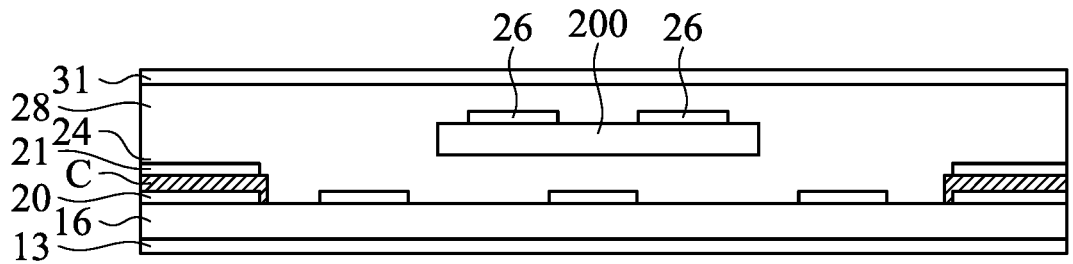
Figure 11K:
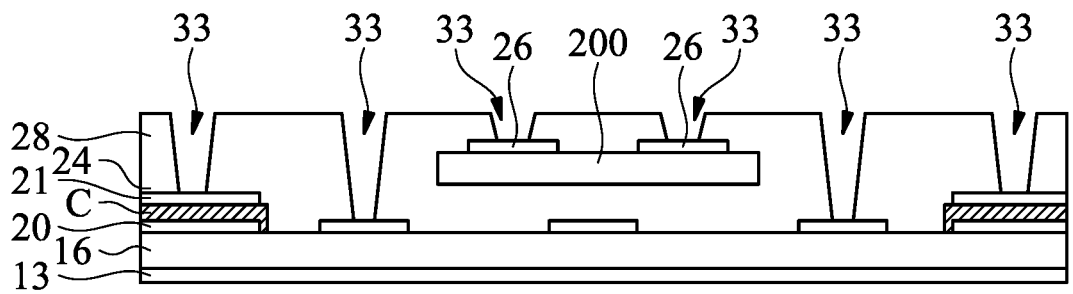
Figure 11L:
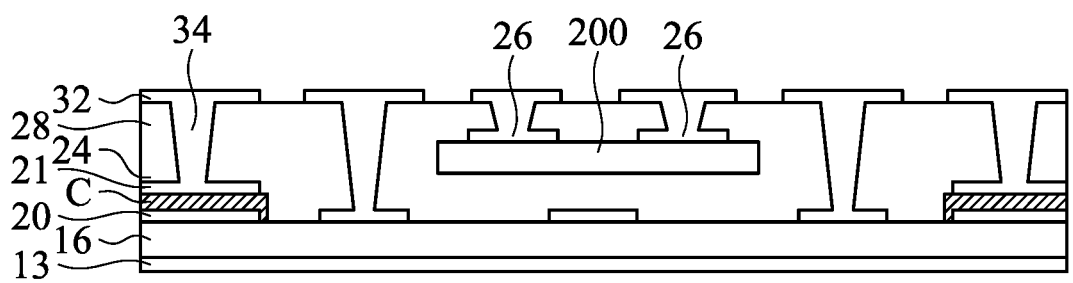

In FIG. 11G, an insulating layer 24 is formed on the structure to allow the wiring layers 20 and 21 and the capacitor C to be embedded in the insulating layer 24. The material and process of the insulating layer 24 are identical or similar to the aforementioned embodiments, and is not repeated. In FIG. 11H, a chip 200 is disposed on the insulating layer 24, and conductive pads 26 are disposed on the chip 200. In FIG. 11I, additional dielectric material is disposed on the insulating layer 24 (FIG. 11H) and the chip 200 to form an insulating layer 28 with the insulating layer 24 (FIG. 11H). At the same time, the chip 200 is embedded in the insulating layer 28. In FIG. 11J, a layer of protective layer 31 is disposed on the insulating layer 28, and the protective layer 31 may be, for example, photoresist material. In FIG. 11K, holes 33 are formed in the insulating layer 28, and the protective layer 31 is removed. A patterning process may be performed with the protective layer 31 to the insulating layer 28, and then the holes 33 may be formed by processes such as chemical etching, etc. As a result, the holes 33 may have tilted sidewalls. However, the present disclosure is not limited thereto. In some embodiments, the holes 33 may be formed by laser etching drilling process to obtain holes 33 having vertical sidewalls, depending on design requirements. In FIG. 11L, a wiring layer 32 and vias 34 are formed on the insulating layer 28 and in the holes 33, respectively. The wiring layer 32 and the vias 34 may be formed by suitable deposition and patterning processes.

Figure 11M:
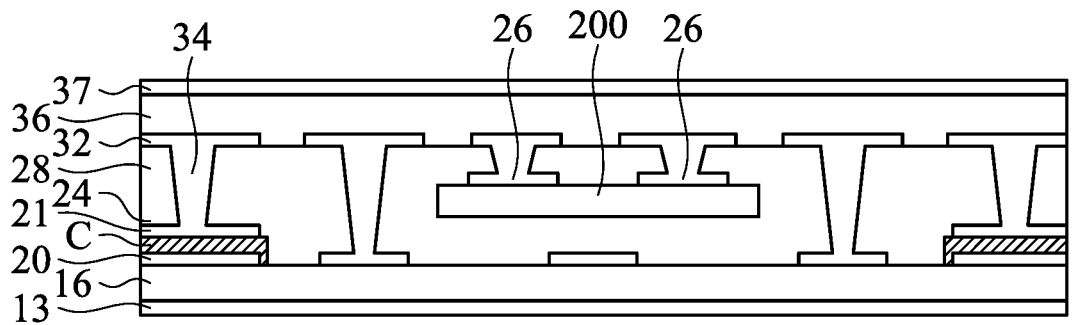
Figure 11N:
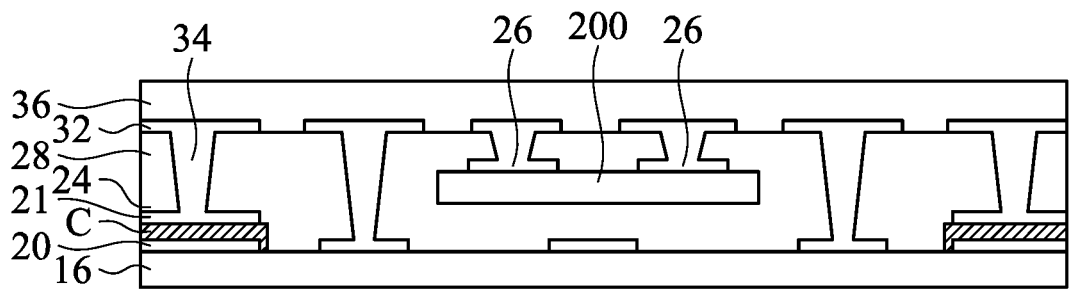

Afterwards, in FIG. 11M, an insulating layer 36 is formed on the insulating layer 28 and the wiring layer 32, and a protective layer 37 is formed on the insulating layer 36. The process and material of the insulating layer 36 are described above, and are not repeated. The protective layer 37 may be a patterned photoresist layer to allow the material under the protective layer 37 to be patterned in the subsequent etching process. In FIG. 11N, the material under the protective layers 13 and 37 are patterned by the protective layers 13 and 37, and the protective layers 13 and 37 are removed after the patterning process.

Figure 11O:
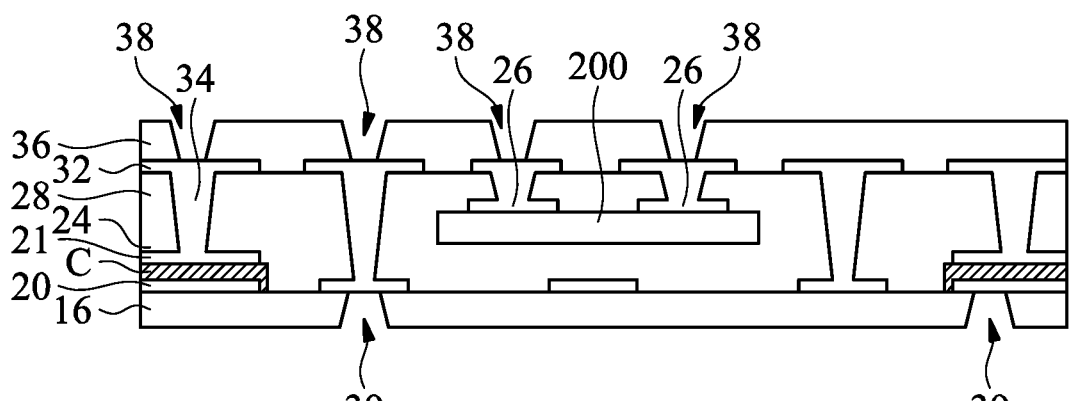
Figure 11P:
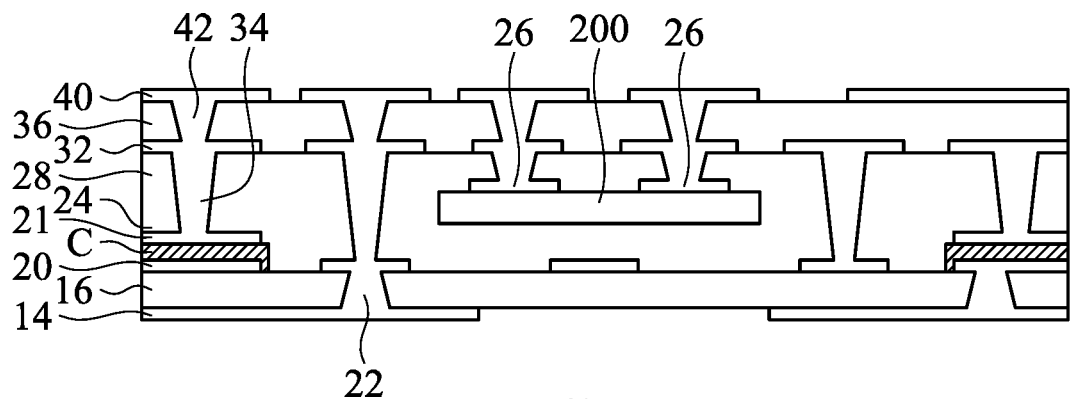
Figure 11Q:
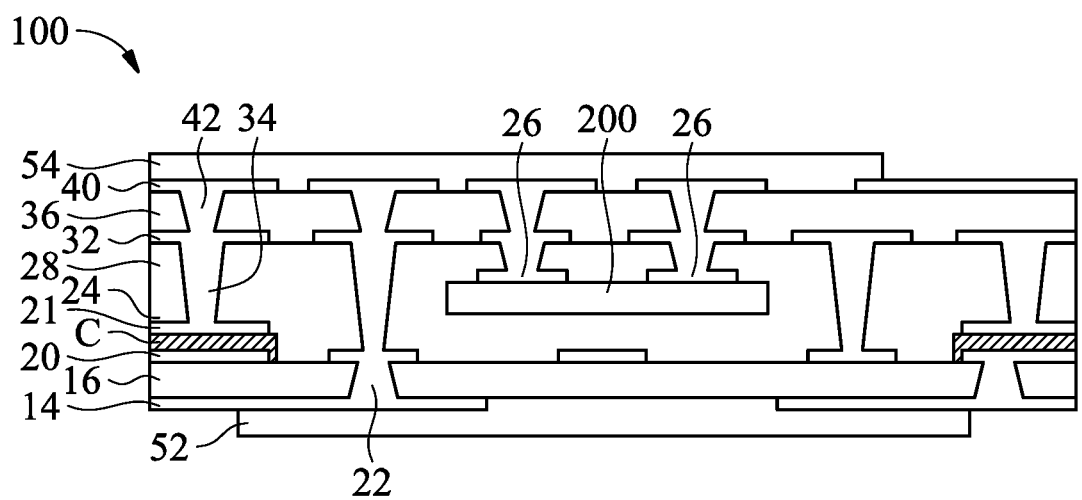

In FIG. 11O, the patterned insulating layers 36 and 16 are patterned to form holes 38 and 39 in the patterned insulating layers 36 and 16, respectively. In this embodiment, the holes 38 and 39 may have tilted sidewalls, but the present disclosure is not limited thereto. For example, the holes 38 or 39 may be formed by, for example, laser etching drilling process to allow the holes 38 or 39 to have vertical sidewalls. Afterwards, in FIG. 11P, wiring layers 14 and 40 are formed on the insulating layers 16 and 36, and vias 22 and 42 are formed in the insulating layers 16 and 36, respectively. Finally, in FIG. 11Q, a passivation layer 52 is disposed on the wiring layer 14 and the insulating layer 16, and a passivation layer 54 is disposed on the insulating layer 36 and the wiring layer 40 to form the substrate 100.

In summary, a micro sensor is provided in some embodiments of the present disclosure, and the chip of the micro sensor may be disposed in the substrate. Furthermore, a through hole corresponding to the sensing element is formed on the substrate in some embodiments of the present disclosure. Further, a method of forming various elements (e.g. passive elements) in the substrate is provided in some embodiments of the present disclosure. Finally, a method of forming the substrate is provided in some embodiments of the present disclosure. By the sensor and the method of forming the micro sensor, the dimension of the micro sensor may be decreased to achieve miniaturization, and the effect of the sensing element may be increased.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensor, comprising:
a substrate having a plate-like shape and comprising a surface, a first insulating layer, a second insulating layer, and an interconnect structure;
a chip embedded in the substrate and electrically connected to the interconnect structure, wherein the first insulating layer and the second insulating layer overlap the chip when viewed in a direction that is perpendicular to the surface, and the chip is located between the first insulating layer and the second insulating layer when viewed in a direction that is parallel to the surface; and
a first sensing element disposed on the surface and electrically connected to the chip through the interconnect structure, wherein the first insulating layer and the second insulating layer at least partially overlap the first sensing element when viewed in the direction that is perpendicular to the surface;
wherein the substrate comprises a hollow through hole filling with air overlapping a portion of the first sensing element in the direction that is perpendicular to the surface to allow the first sensing element to communicate with the external environment, and the first sensing element is exposed from the hollow through hole when viewed in the direction that is perpendicular to the surface;
wherein the hollow through hole comprises a first segment, a second segment, a third segment, and a fourth segment sequentially arranged in the direction that is perpendicular to the surface;
wherein dimensions of the first segment and the second segment are different, the dimension of the second segment is less than the dimensions of the first segment and the third segment, and a dimension of the third segment is greater than a dimension of the fourth segment.

2. The sensor as claimed in claim 1, further comprising a case disposed on the substrate, wherein the substrate and the case form a space, and the first sensing element is disposed in the space.

3. The sensor as claimed in claim 1, wherein the dimension of the first segment is greater than the dimensions of the second segment and the fourth segment.

4. The sensor as claimed in claim 1, wherein a distance between the first segment and the first sensing element is greater than a distance between the third segment and the first sensing element, and the dimension of the third segment is greater than the dimensions of the first segment and the second segment.

5. The sensor as claimed in claim 1, further comprising a passive element disposed in the substrate and electrically connected to the chip.

6. The sensor as claimed in claim 5, wherein the passive element is formed from the interconnect structure.

7. The sensor as claimed in claim 1, wherein at least a portion of the chip overlaps the first sensing element in a direction that is perpendicular to the surface.

8. The sensor as claimed in claim 1, further comprising a second sensing element disposed on the substrate, and the first sensing element and the second sensing element are disposed on opposite sides of the substrate.

9. The sensor as claimed in claim 1, further comprising a circuit board disposed on the side of the substrate where the first sensing element is disposed, and the circuit board is electrically connected to the substrate.

10. The sensor as claimed in claim 9, wherein a gap is formed between the first sensing element and the circuit board in a direction that is perpendicular to the surface.

11. The sensor as claimed in claim 9, further comprising sealing material disposed between the substrate and the circuit board, wherein the substrate further comprises a through hole that partially overlaps the first sensing element in a direction that is perpendicular to the surface, and the sealing material covers the through hole.

12. The sensor as claimed in claim 9, wherein the circuit board comprises a hole that partially overlaps the first sensing element in a direction that is perpendicular to the surface.

13. The sensor as claimed in claim 12, further comprising sealing material disposed between the substrate and the circuit board, and the sealing material covers the hole in a direction that is perpendicular to the surface.

14. The sensor as claimed in claim 1, further comprising a second sensing element, wherein the substrate comprises a recess, and the second sensing element is disposed in the recess.

15. The sensor as claimed in claim 3, wherein the hollow through hole further comprises a fifth segment,
wherein the fifth segment, the fourth segment and the first segment are sequentially arranged in the direction that is perpendicular to the surface, and the dimension of the fourth segment is less than the dimensions of the first segment and the fifth segment.

* * * * *